(12) United States Patent
Yamazaki et al.

(10) Patent No.: US 9,564,473 B2
(45) Date of Patent: Feb. 7, 2017

(54) DISPLAY DEVICE

(71) Applicant: Semiconductor Energy Laboratory Co., Ltd., Atsugi-shi, Kanagawa-ken (JP)

(72) Inventors: Shunpei Yamazaki, Setagaya (JP); Yoshiharu Hirakata, Ebina (JP); Hisao Ikeda, Zama (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/819,962

(22) Filed: Aug. 6, 2015

(65) Prior Publication Data

US 2016/0035797 A1 Feb. 4, 2016

Related U.S. Application Data

(62) Division of application No. 14/255,257, filed on Apr. 17, 2014, now Pat. No. 9,111,841.

(30) Foreign Application Priority Data

Apr. 24, 2013 (JP) ................................. 2013-090873

(51) Int. Cl.
*H01L 27/20* (2006.01)
*H01L 27/32* (2006.01)
(Continued)

(52) U.S. Cl.
CPC ......... *H01L 27/323* (2013.01); *G02F 1/13338* (2013.01); *G02F 1/133305* (2013.01);
(Continued)

(58) Field of Classification Search
CPC ...... H01L 51/5237; H01L 21/48; H01L 27/16; H01L 27/323
(Continued)

(56) References Cited

U.S. PATENT DOCUMENTS 7,414,594 B2   8/2008   Kim et al.
7,548,415 B2   6/2009   Kim
(Continued)

FOREIGN PATENT DOCUMENTS

CN   001447930 A   10/2003
CN   001961276 A   5/2007
(Continued)

OTHER PUBLICATIONS

International Search Report (Application No. PCT/JP2014/061113) Dated Jul. 8, 2014.
(Continued)

*Primary Examiner* — Michael Lebentritt
(74) *Attorney, Agent, or Firm* — Robinson Intellectual Property Law Office; Eric J. Robinson

(57) ABSTRACT

Display of a display device is made less likely to appear divided when a plurality of display panels are used as one screen. Provided is a display device including two display units and a foldable housing that includes a joint portion between the two display units and supports the two display units. Each display unit includes a display panel including a display region and a non-display region and a support having a first surface overlapped with the display region and a second surface that meets the first surface and is overlapped with the non-display region. The two display units are placed in the housing in an opened state such that the first surfaces of the supports face the same direction and the second surfaces of the supports face each other.

20 Claims, 13 Drawing Sheets

(51) Int. Cl.
*H01L 27/15* (2006.01)
*G02F 1/1333* (2006.01)
*H01L 51/52* (2006.01)
*H03K 17/96* (2006.01)

(52) U.S. Cl.
CPC ...... *G02F 1/133308* (2013.01); *H01L 27/156* (2013.01); *H01L 27/3244* (2013.01); *H01L 27/3293* (2013.01); *H01L 51/5237* (2013.01); *H03K 17/962* (2013.01); *H03K 17/9627* (2013.01); *H01L 2251/5338* (2013.01)

(58) Field of Classification Search
USPC .......................................................... 257/88
See application file for complete search history.

(56) References Cited

U.S. PATENT DOCUMENTS

| | | | |
|---|---|---|---|
| 8,063,400 | B2 | 11/2011 | Sugimoto |
| 8,213,167 | B2 | 7/2012 | Kim |
| 8,306,575 | B2 | 11/2012 | Kubodera et al. |
| 8,319,725 | B2 | 11/2012 | Okamoto et al. |
| 8,372,668 | B2 | 2/2013 | Hatano et al. |
| 8,415,208 | B2 | 4/2013 | Takayama et al. |
| 8,427,420 | B2 | 4/2013 | Yamazaki et al. |
| 8,516,728 | B2 | 8/2013 | Jung |
| 8,593,061 | B2 | 11/2013 | Yamada |
| 8,610,118 | B2 | 12/2013 | Yamazaki et al. |
| 8,610,155 | B2 | 12/2013 | Hatano et al. |
| 8,736,162 | B2 | 5/2014 | Jin et al. |
| 8,760,364 | B2 | 6/2014 | Kim et al. |
| 8,848,100 | B2 | 9/2014 | Kuwahara et al. |
| 9,111,841 | B2 * | 8/2015 | Yamazaki ............ H01L 51/5237 |
| 2003/0189759 | A1 | 10/2003 | Kim et al. |
| 2003/0201974 | A1 | 10/2003 | Yin |
| 2006/0034042 | A1 | 2/2006 | Hisano et al. |
| 2006/0238440 | A1 | 10/2006 | Kim et al. |
| 2008/0049389 | A1 | 2/2008 | Kim |
| 2009/0075702 | A1 | 3/2009 | Kubodera et al. |
| 2010/0052503 | A1 | 3/2010 | Fukagawa |
| 2010/0053858 | A1 | 3/2010 | Kim |
| 2010/0065832 | A1 | 3/2010 | Sugimoto |
| 2010/0253902 | A1 | 10/2010 | Yamazaki et al. |
| 2010/0293782 | A1 | 11/2010 | Yamazaki et al. |
| 2010/0317409 | A1 | 12/2010 | Jiang et al. |
| 2011/0050657 | A1 | 3/2011 | Yamada |
| 2011/0279351 | A1 | 11/2011 | Kim et al. |
| 2012/0008267 | A1 | 1/2012 | Watanabe |
| 2012/0200758 | A1 | 8/2012 | Kuwahara et al. |
| 2012/0236484 | A1 | 9/2012 | Miyake |
| 2013/0002133 | A1 | 1/2013 | Jin et al. |
| 2013/0002583 | A1 | 1/2013 | Jin et al. |
| 2013/0012272 | A1 | 1/2013 | Yamazaki et al. |
| 2013/0180882 | A1 | 7/2013 | Hamers et al. |
| 2013/0181955 | A1 | 7/2013 | Okamoto et al. |
| 2013/0194761 | A1 | 8/2013 | Kim |
| 2013/0300697 | A1 | 11/2013 | Kim et al. |
| 2013/0314346 | A1 | 11/2013 | Yamazaki et al. |
| 2013/0314578 | A1 | 11/2013 | Imaizumi et al. |
| 2014/0036162 | A1 | 2/2014 | Sato et al. |
| 2014/0232971 | A1 | 8/2014 | Kubota et al. |

FOREIGN PATENT DOCUMENTS

| | | |
|---|---|---|
| CN | 101354856 A | 1/2009 |
| CN | 101388918 A | 3/2009 |
| CN | 101996535 A | 3/2011 |
| CN | 102640074 A | 8/2012 |
| CN | 102855821 A | 1/2013 |
| CN | 102855822 A | 1/2013 |
| CN | 202816269 U | 3/2013 |
| CN | 202887620 U | 4/2013 |
| DE | 102012211232 | 1/2013 |
| EP | 2133854 A | 12/2009 |
| EP | 2541371 A | 1/2013 |
| JP | 2000-184026 A | 6/2000 |
| JP | 2003-050554 A | 2/2003 |
| JP | 2003-174153 A | 6/2003 |
| JP | 2003-345286 A | 12/2003 |
| JP | 2004-510186 | 4/2004 |
| JP | 2006-005712 A | 1/2006 |
| JP | 2007-326259 A | 12/2007 |
| JP | 2008-501143 | 1/2008 |
| JP | 2009-089377 A | 4/2009 |
| JP | 2009-205897 A | 9/2009 |
| JP | 2011-047977 A | 3/2011 |
| JP | 2011-119831 A | 6/2011 |
| JP | 2013-015835 A | 1/2013 |
| JP | 2013-015836 A | 1/2013 |
| KR | 2002-0022216 A | 3/2002 |
| KR | 2002-0061045 A | 7/2002 |
| KR | 2003-0020520 A | 3/2003 |
| KR | 2005-0114432 A | 12/2005 |
| KR | 2013-0004085 A | 1/2013 |
| KR | 2013-0007311 A | 1/2013 |
| TW | 201306339 | 2/2013 |
| TW | 201311066 | 3/2013 |
| WO | WO-02/25362 | 3/2002 |
| WO | WO-2005/119409 | 12/2005 |
| WO | WO-2008/123416 | 10/2008 |
| WO | WO-2008/126250 | 10/2008 |
| WO | WO-2010/106590 | 9/2010 |
| WO | WO-2011/067921 | 6/2011 |

OTHER PUBLICATIONS

Written Opinion (Application No. PCT/JP2014/061113) Dated Jul. 8, 2014.

* cited by examiner

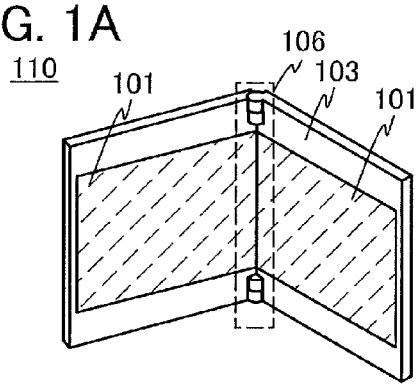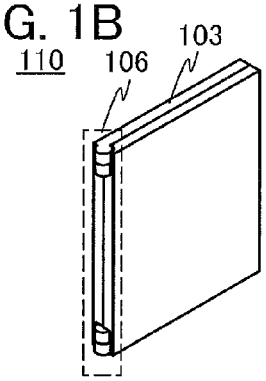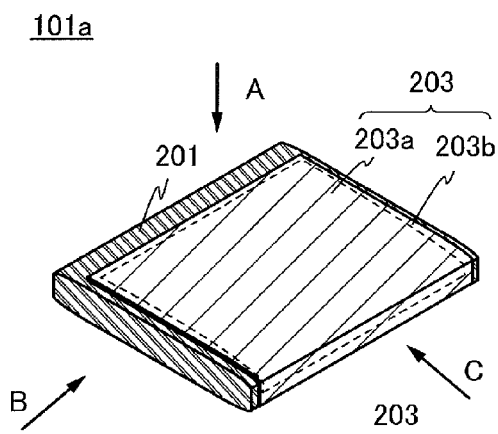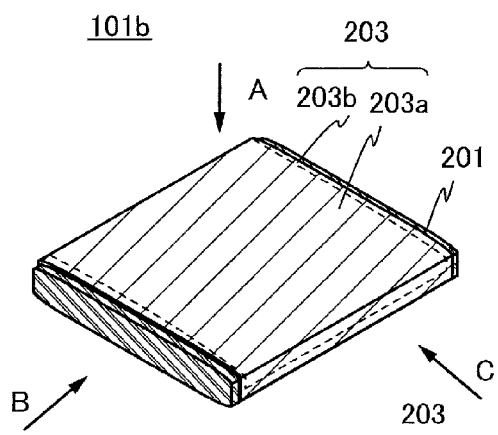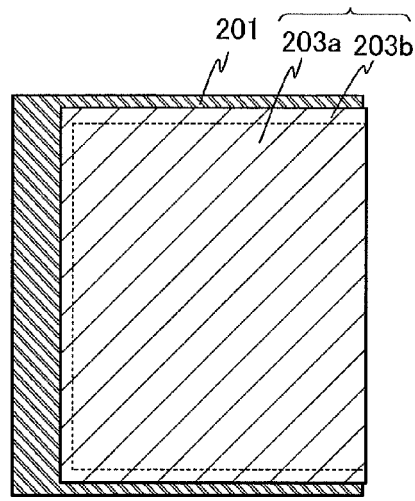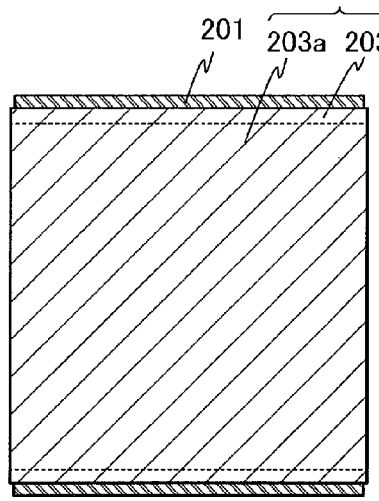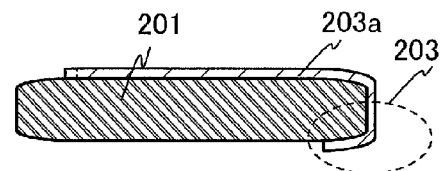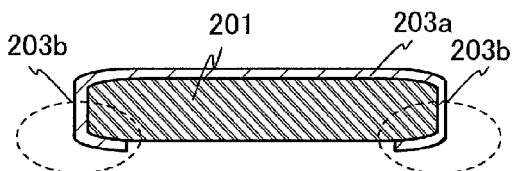

DISPLAY DEVICE

TECHNICAL FIELD

The present invention relates to a display device, an electronic device, or a manufacturing method thereof. The present invention particularly relates to a display device or an electronic device utilizing electroluminescence (hereinafter also referred to as EL) or a manufacturing method thereof.

BACKGROUND ART

Recent display devices are expected to be applied to a variety of uses and become diversified. For example, display devices for mobile devices and the like are required to be small, thin, and lightweight. In addition, display devices desirably have large screens (wide display regions), and a reduction in the area of a display device except a display region (what is called a narrower bezel) is required.

Light-emitting elements utilizing EL (also referred to as EL elements) have features such as ease of thinning and lightening, high-speed response to input signal, and driving with a direct-current low voltage source; therefore, application of the light-emitting elements to display devices has been proposed.

For example, Patent Document 1 discloses a foldable portable communication device that has reduced size and weight and that includes a plurality of displays and can be opened and closed so as to have a large screen.

PATENT DOCUMENT

[Patent Document 1] Japanese Published Patent Application No. 2000-184026

DISCLOSURE OF INVENTION

However, since each display has a non-display region that surrounds a display region, in the structure of Patent Document 1, the non-display region exists at the joint between the two displays and in the vicinity thereof. The wider the non-display region is, the more divided an image displayed with the plurality of displays appears to a viewer.

An object of one embodiment of the present invention is to provide a novel display device or electronic device. Another object of one embodiment of the present invention is to provide a display device or an electronic device of which display is less likely to appear divided when a plurality of display panels are used as one screen. Another object of one embodiment of the present invention is to provide a small display device or electronic device. Another object of one embodiment of the present invention is to provide a lightweight display device or electronic device. Another object of one embodiment of the present invention is to provide a display device or an electronic device with a narrow bezel. Another object of one embodiment of the present invention is to provide a display device or an electronic device that is less likely to be broken.

In one embodiment of the present invention, there is no need to achieve all the above objects.

One embodiment of the present invention is a display device including two display units and a foldable housing that includes a joint portion between the two display units and supports the two display units. Each display unit includes a display panel including a display region and a non-display region and a support having a first surface overlapped with the display region and a second surface that meets the first surface and is overlapped with the non-display region. The two display units are placed in the housing in an opened state such that the first surfaces of the supports face the same direction and the second surfaces of the supports face each other.

In the above structure, the display panel preferably has flexibility.

In the above structure, the display region preferably overlaps with the second surface.

In the above structure, the two display units are preferably placed in the housing in an opened state to be in contact with each other such that the second surfaces of the supports face each other.

In the above structure, the two display units are preferably placed so as to be detachable from the housing.

In the above structure, the distance between the two display units is preferably adjustable. For example, it is preferable that at least one display unit can be moved toward the other display unit.

In the above structure, the support preferably has a third surface that is opposite to the second surface and is overlapped with the non-display region of the display panel. Further, the third surface is preferably overlapped with the display region.

Embodiments of the present invention also include an electronic device including the above display device.

In one embodiment of the present invention, a novel display device or electronic device can be provided. In one embodiment of the present invention, a display device or an electronic device of which display is less likely to appear divided when a plurality of display panels are used as one screen can be provided. In one embodiment of the present invention, a small display device or electronic device can be provided. In one embodiment of the present invention, a lightweight display device or electronic device can be provided. In one embodiment of the present invention, a display device or an electronic device with a narrow bezel can be provided. In one embodiment of the present invention, a display device or an electronic device that is less likely to be broken can be provided.

BRIEF DESCRIPTION OF DRAWINGS

FIGS. 1A to 1D illustrate examples of a display device and a display unit.

BEST MODE FOR CARRYING OUT THE INVENTION

Figure 2A:
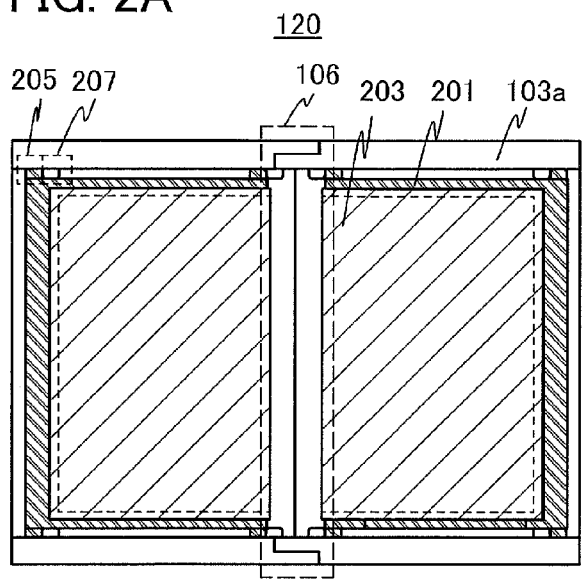
FIGS. 2A to 2D illustrate an example of a display device.

Embodiments will be described in detail with reference to drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

In addition, the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Embodiment 1

Display devices of embodiments of the present invention will be described with reference to FIGS. 1A to 1D, FIGS. 2A to 2D, FIGS. 3A to 3C, FIGS. 4A and 4B, FIGS. 5A to 5C, FIGS. 6A and 6B, and FIGS. 7A and 7B.

<Structure of Display Device of One Embodiment of the Present Invention>

A display device of one embodiment of the present invention includes two display units and one housing. Each display unit includes a display panel including a display region and a non-display region and a support having a first surface that is overlapped with the display region and a second surface that meets the first surface and is overlapped with the non-display region. The housing is foldable. The housing includes a joint portion between the two display units. The housing supports the two display units. The two display units are placed in the housing in an opened state with the first surfaces of the supports facing the same direction and the second surfaces of the supports facing each other. Display in the display regions of the display panels, which overlap with the first surfaces of the supports, is viewed by a user of the display device. Note that in one embodiment of the present invention, a first surface of a support refers to a surface that is overlapped with a display region of a display panel without any other surface of the support positioned therebetween. Similarly, in one embodiment of the present invention, a second surface of a support refers to a surface that is overlapped with a non-display region of a display panel without any other surface of the support positioned therebetween.

The display device of one embodiment of the present invention is foldable. Accordingly, the user can fold the display device into a small shape and carry it easily. Further, the user can view large-screen display by opening the display device and using the two display units as one screen. In the display device of one embodiment of the present invention, almost no non-display region exists (or a non-display region does not exist) between the display region in one display unit and the display region in the other display unit; thus, display is less likely to appear divided when the two display units are used as one screen. Moreover, even when the display device is opened and closed repeatedly, the display panel itself is not deformed (not bent or expanded/contracted). In other words, for example, a decrease in the lifetime of the display panel due to deformation is reduced and the display device of one embodiment of the present invention has high reliability.

First, an example of a structure of a display device is described.

FIG. 1A is a perspective view of a display device 110 that is being opened, and FIG. 1B is a perspective view of the display device 110 that is folded.

The display device 110 includes a housing 103 and two display units 101. The two display units 101 may have the same structure or different structures.

The housing 103 is foldable. The housing 103 includes a joint portion 106 (e.g., a hinge) positioned between the two display units 101 (specifically, the joint portion 106 overlaps with part of the two display units 101 between the two display units 101). The housing 103 supports the two display units 101.

FIG. 1A shows an example in which the housing 103 has a depressed portion and the display units 101 are placed in the depressed portion. The display units 101 may be bonded to the housing 103 or may be detachably mounted thereon.

The display device 110 is foldable. Accordingly, a user can fold the display device 110 into a small shape and carry it easily. Further, the user can view large-screen display by opening the display device 110 and using the two display units as one screen. Moreover, even when the display device 110 is opened and closed repeatedly, the display unit 101 itself is not deformed. In other words, for example, a decrease in the lifetime of the display unit 101 due to deformation is reduced and the display device 110 has high reliability.

FIGS. 1C and 1D each illustrate an example of a structure of the display unit 101.

FIG. 1C shows a perspective view of a display unit 101a and plan views seen in the directions of arrow A and arrow B in the perspective view. FIG. 1D shows a perspective view of a display unit 101b and plan views seen in the directions of arrow A and arrow B in the perspective view.

The display units 101a and 101b each include a support 201 and a display panel 203. The display panel 203 has a display region 203a and a non-display region 203b.

In the display units 101a and 101b, the display region 203a overlaps with a first surface of the support 201 that can be viewed in the direction of arrow A in the perspective view, and the non-display region 203b overlaps with a second surface of the support 201 that can be viewed in the direction of arrow C in the perspective view. Further, in the display unit 101b, the non-display region 203b overlaps with a third surface of the support 201 that is opposite to the second surface. Here, in the plan views in FIGS. 1C and 1D that are seen in the direction of arrow B in the perspective views, the non-display region 203b in the display panel 203 is indicated by dotted circles.

In the display panel, for example, the non-display region is provided to surround the display region. In one embodiment of the present invention, as in the display unit 101a, one of two surfaces in series of the support 201 (first surface) is overlapped with the display region 203a, and the other (second surface) is overlapped with the non-display region 203b. When the display panel 203 overlaps with two or more surfaces of the support 201, the proportion of the area of the first surface occupied by the display region 203a is increased and the display unit can have a narrow bezel, as compared with the case where the display panel 203 overlaps with only one surface of the support 201.

Further, when the display panel 203 overlaps with three or more surfaces of the support 201 and the non-display region 203b overlaps with the two separate surfaces among three surfaces in series of the support 201 (second and third surfaces) and the display region 203a overlaps with the surface between the two separate surfaces (first surface), as in the display unit 101b, the proportion of the area of the first surface occupied by the display region 203a is further increased and the display unit can have a narrower bezel.

When at least one of the display units 101a and 101b is used for the display units 101 in FIG. 1A, in the vicinity of a region where the two display units 101 are in contact with each other, almost no non-display region exists between the display region 203a in one display unit and the display region 203a in the other display unit. Therefore, display of the display device is less likely to appear divided when the two display units 101 are used as one screen.

As shown in FIGS. 1C and 1D, the non-display region 203b may overlap with the surface opposite to the first surface.

The non-display region 203b can overlap with the surface of the support 201 opposite to the first surface and the surface meeting the first surface (the second surface or the third surface); accordingly, a bezel of a display panel included in a display unit of one embodiment of the present invention does not need to be narrow. For example, in the case of a display panel using an organic EL element, the wider the area of the non-display region 203b surrounding the display region 203a is, the longer the distance between the edge of the display panel and the organic EL element is. This is preferable because an impurity such as moisture or oxygen is less likely to enter (or reach) the organic EL element from the outside of the display panel, leading to higher reliability of the display panel.

Figure 7A:
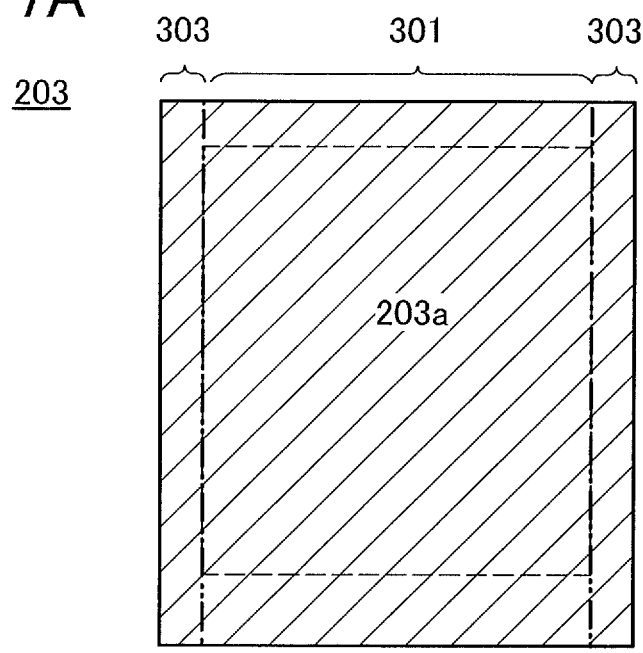
FIGS. 7A and 7B each illustrate an example of a display panel.
Figure 7B:
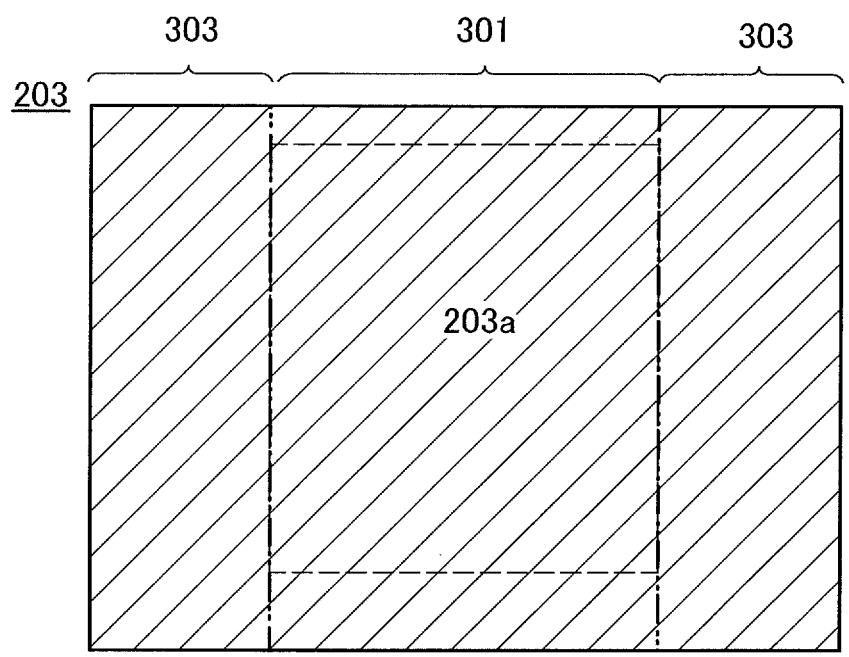

In the display panels shown in FIGS. 7A and 7B, a region 301 is a region of the display panel that overlaps with the first surface of the support 201, and a region 303 is a region of the display panel that overlaps with the surface of the support 201 opposite to the first surface or the surface meeting the first surface (the second surface or the third surface). In FIGS. 7A and 7B, the area of the display region 203a is the same. The display region 203a is entirely included in a region overlapping with the first surface. In FIG. 7B, the region 303 is wider than in FIG. 7A. This is preferable because an external impurity such as moisture or oxygen is less likely to reach the organic EL element through the edge of the display panel. For example, the area of a region where the display panel 203 overlaps with the surface of the support 201 opposite to the first surface is preferably 10% or more, further preferably 30% or more, still further preferably 50% or more of the area of the surface opposite to the first surface.

Further, as shown in FIGS. 1C and 1D, the display region 203a preferably overlaps with the second surface as well as the first surface. When at least one of the display units 101a and 101b is used for the display units 101 in FIG. 1A, in the vicinity of a region where the two display units 101 are in contact with each other, almost no non-display region exists between the display region 203a in one display unit and the display region 203a in the other display unit. Therefore, display of the display device is less likely to appear divided when the two display units 101 are used as one screen.

Moreover, in the display unit 101b, the display region 203a preferably overlaps with the third surface, in which case the proportion of the area of the first surface occupied by the display region 203a is increased.

Next, another example of a structure of a display device is described.

Figure 2B:
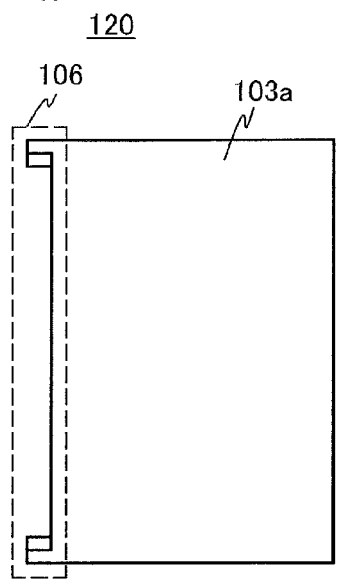
Figure 2C:
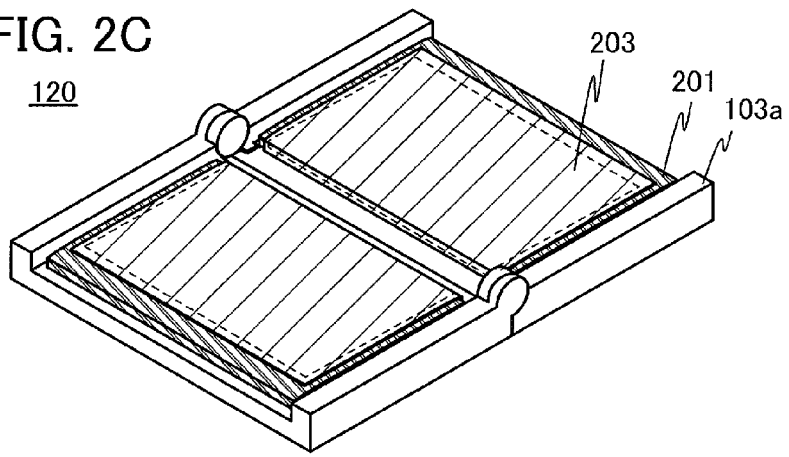
Figure 2D:
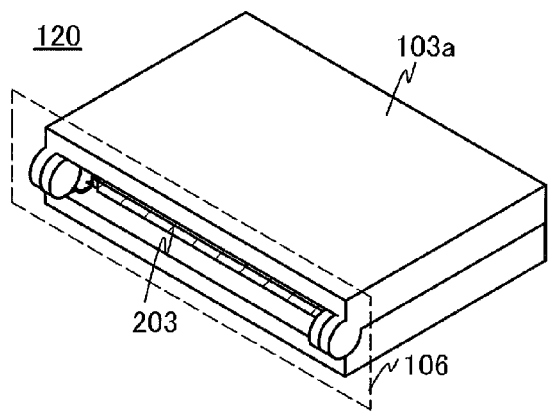

FIG. 2A is a plan view of a display device 120 that is opened. FIG. 2B is a plan view of the display device 120 that is folded. FIG. 2C is a perspective view of the display device 120 that is opened. FIG. 2D is a perspective view of the display device 120 that is folded.

The display device 120 includes a housing 103a and two display units (each display unit includes the support 201 and the display panel 203). The distance between the two display units is adjustable. In a display device of one embodiment of the present invention, at least one of two display units can be moved in the lateral direction of FIG. 2A. The display device 120 is shown as an example in which both of the two display units can be moved in the lateral direction of FIG. 2A.

Figure 3A:
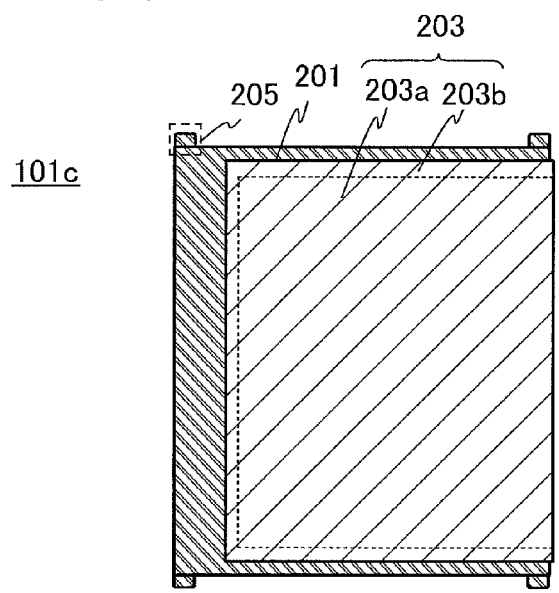
FIGS. 3A to 3C illustrate examples of a display device and a display unit.
Figure 3B:
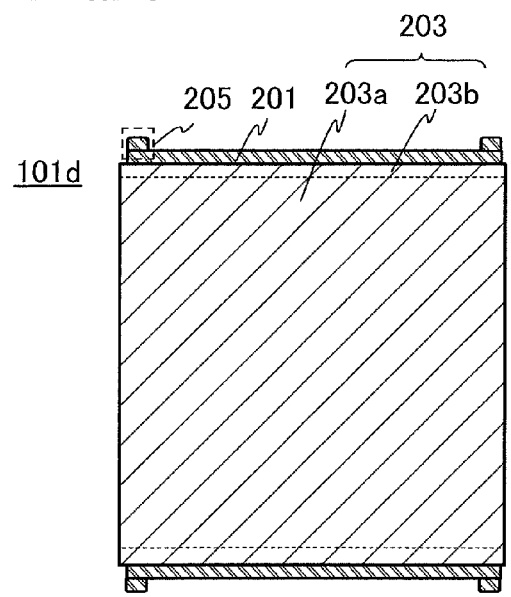

Here, in the display device 120, each of the two display units is a display unit 101c shown in FIG. 3A; however, one embodiment of the present invention is not limited thereto. For example, any of the display units 101a and 101b shown in FIGS. 1C and 1D and a display unit 101d shown in FIG. 3B can be used. For example, one of the two display units may be the display unit 101a and the other may be the display unit 101c. Note that the structure of the display unit 101c is the same as that of the display unit 101a except for having a projection 205, and the structure of the display unit 101d is the same as that of the display unit 101b except for having the projection 205.

Figure 6A:
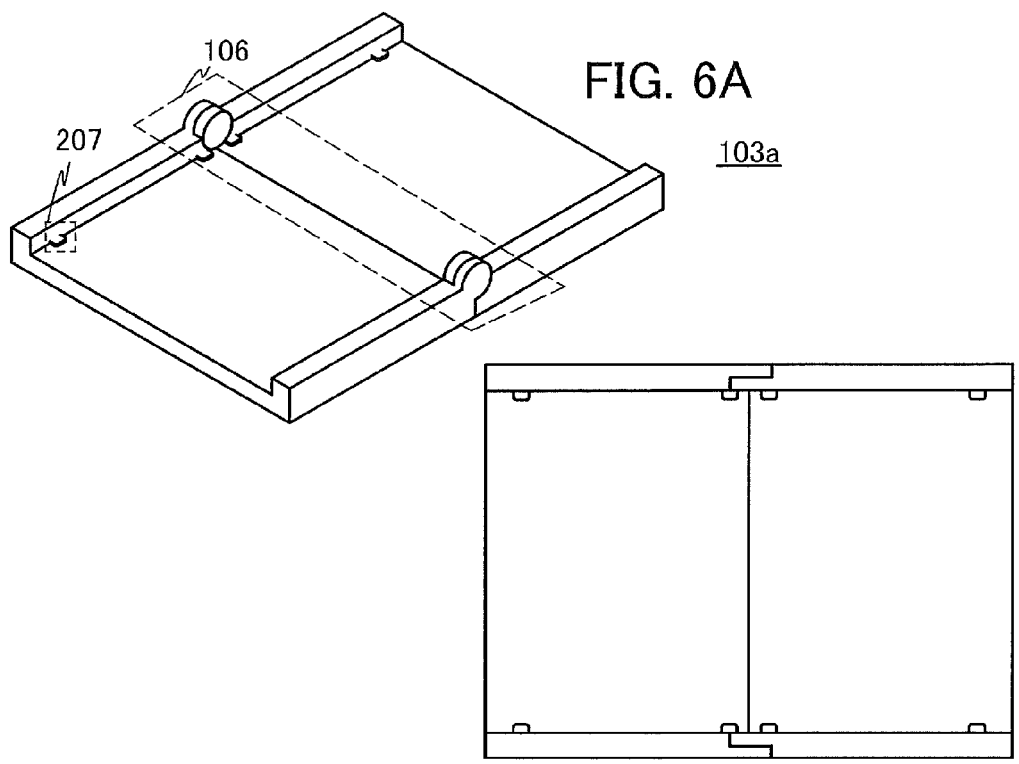
FIGS. 6A and 6B each illustrate an example of a housing.

FIG. 6A shows a perspective view and a plan view of the housing 103a. The housing 103a is foldable. The housing 103a includes the joint portion 106 positioned between the two display units. The housing 103a has a depressed portion and supports two display units placed in the depressed portion. FIGS. 2A to 2D show an example in which display units are detachably placed in the depressed portion of the housing 103a.

In FIG. 2A, the two display units can be moved in the lateral direction of the drawing and can be fixed to the housing 103a with the projection 205 (e.g., a nail, a hook, a lug, a tab, or a claw) of the support 201 and a projection 207 (e.g., a nail, a hook, a lug, a tab, or a claw) of the housing 103a. There is no particular limitation on the positions of the projection 205 and the projection 207. For example, the projection 207 is provided in contact with the bottom surface or a side surface of the depressed portion of the housing 103a.

FIGS. 2A to 2D show a state where the two display units are apart from each other. It is possible to bring the two display units in contact with or close to each other by moving at least one of the display units. Such a state will be described in detail using a display device 140 shown later in drawings.

When a display device that is opened performs display, the two display units are preferably in contact with each other. Specifically, the two display units are preferably placed in the housing 103a in an opened state to be in contact with each other such that the second surfaces of the supports 201 face each other. In that case, display is less likely to appear divided when the two display units are used as one screen. Note that in the case where the two display units of the opened display device independently perform display, the positions of the two display units are not particularly limited.

Further, when the display device is folded, the two display units are preferably apart from each other. In that case, the edges of the display units do not exist on the same plane as the edge of the folded housing 103a at the side surface including the joint portion 106 of the display device, which is shown in FIG. 2D; thus, the supports 201 and the display panels 203 can be prevented from being damaged and broken.

In FIG. 2B, the display device is folded such that the display units are placed on the inner side of the display device; however, one embodiment of the present invention is not limited thereto.

Figure 3C:
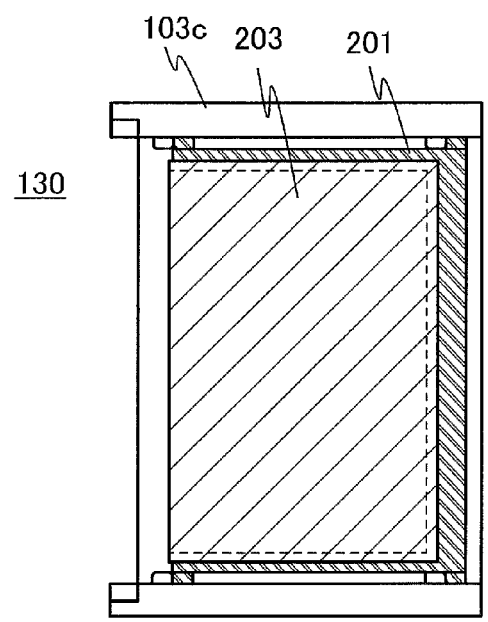

A display device 130 shown in FIG. 3C is folded such that the display units are placed on the outer side of the display device. Accordingly, even in the folded state, the display units on two opposite surfaces of the display device 130 can independently perform display.

A display device of one embodiment of the present invention can be folded such that the display units are on either the outer side or the inner side of the display device. With such a structure, it is possible not only to open the display device and view the display on the display units but also to fold the display device such that the display units are on the outer side of the display device and view the display on the display units. Further, folding the display device such that the display units are on the inner side of the display device enables the display panels to be prevented from being damaged and broken when the display device is not in use.

Another example of a structure of a display device will be described.

Figure 4A:
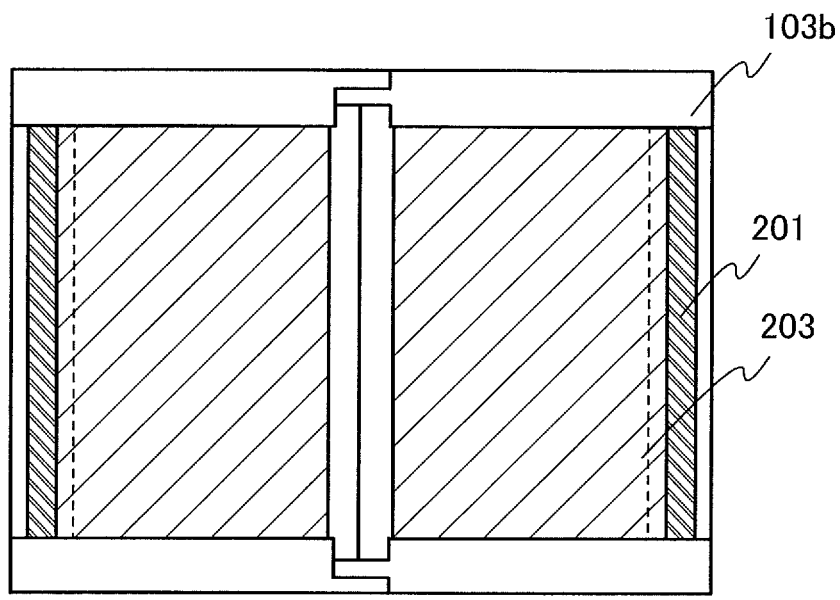
FIGS. 4A and 4B illustrate an example of a display device.
Figure 4B:
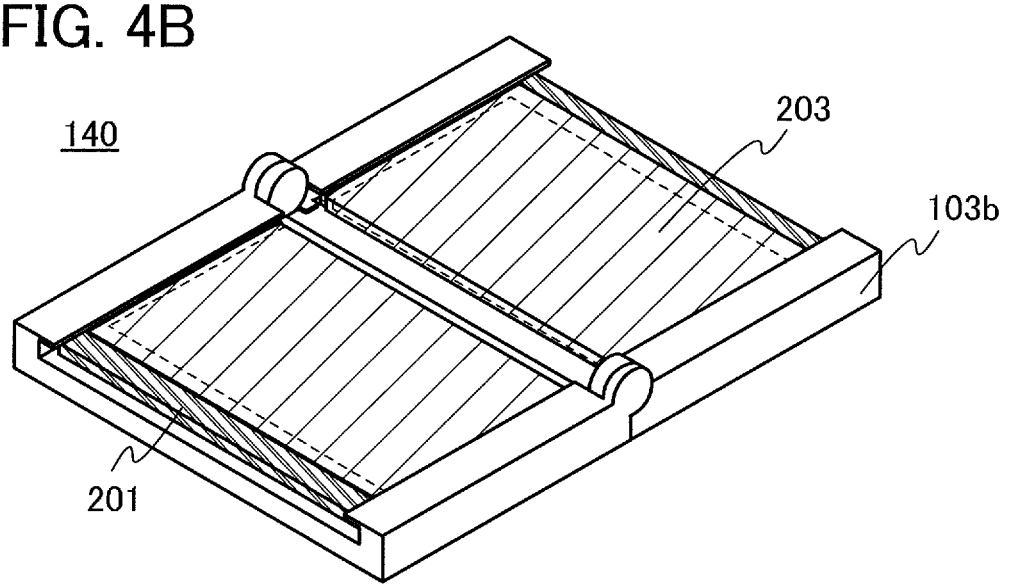
Figure 5A:
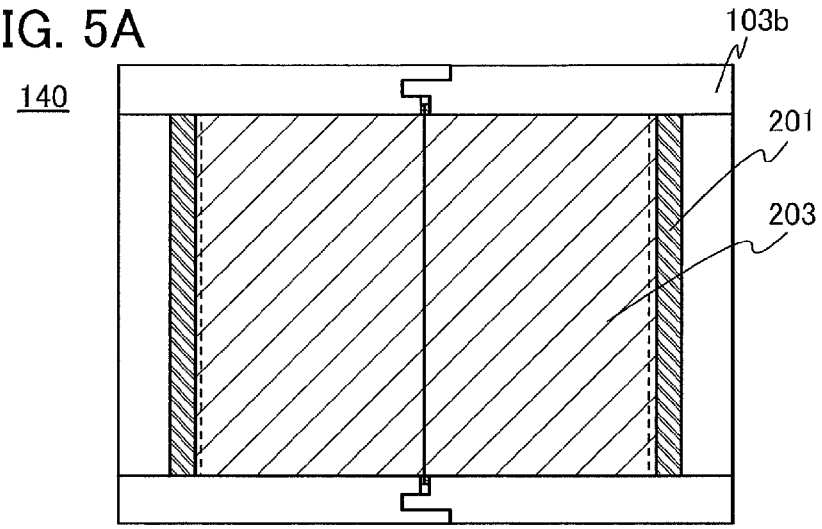
FIGS. 5A to 5C illustrate an example of a display device.
Figure 5B:
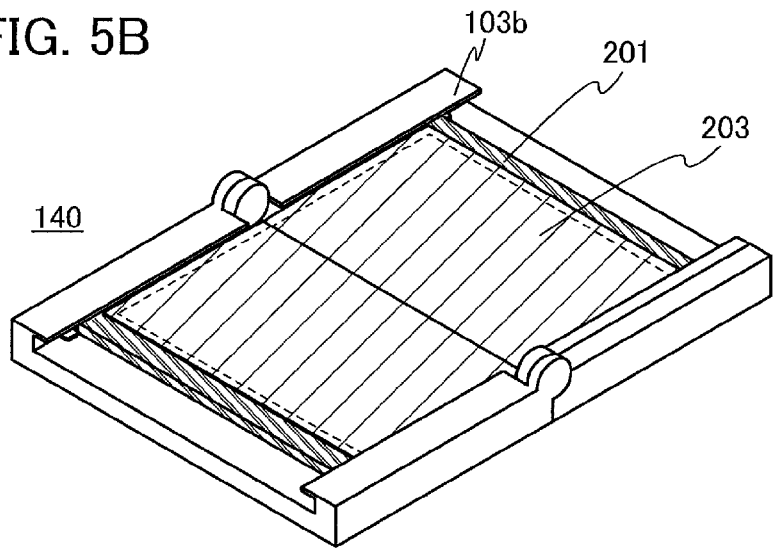
Figure 5C:
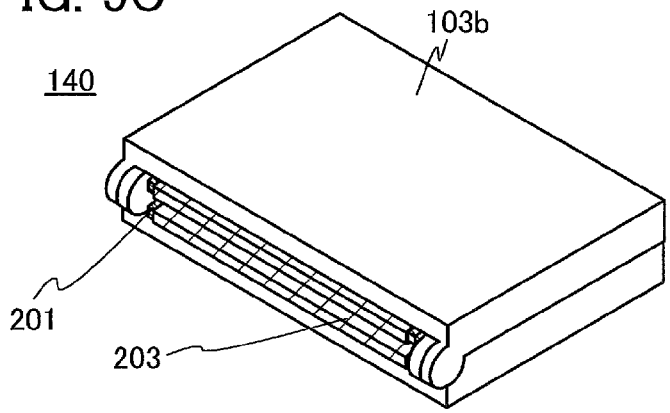

FIG. 4A and FIG. 5A are plan views of the display device 140 that is opened. FIG. 4B and FIG. 5B are perspective views of the display device 140 that is opened. FIG. 5C is a perspective view of the display device 140 that is folded. FIGS. 4A and 4B show the case where two display units are not in contact with each other, and FIGS. 5A to 5C show the case where two display units are in contact with each other.

The display device 140 includes a housing 103b and two display units (each display unit includes the support 201 and the display panel 203). Here, each of the two display units is the display unit 101c shown in FIG. 3A.

Figure 6B:
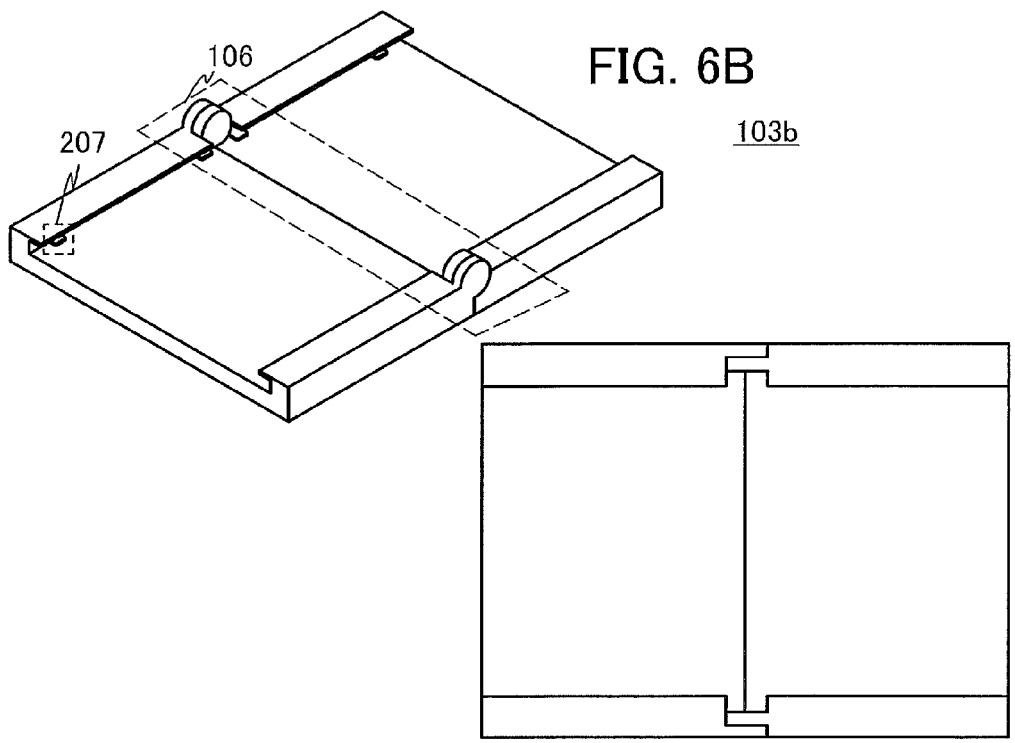

FIG. 6B shows a perspective view and a plan view of the housing 103b. The housing 103b is foldable. The housing 103b includes the joint portion 106 positioned between the two display units. The housing 103b has a groove portion (depressed portion) and supports two display units placed in the groove portion. FIGS. 4A and 4B and FIGS. 5A to 5C show examples in which the display units are detachably placed in the groove portion of the housing 103b. The housing 103b covers part of the first surface of each support 201 (preferably, a portion overlapped with the non-display region of the display panel 203). Thus, the display device is less likely to be broken down into the display units and the housing.

In FIG. 4A and FIG. 5A, the two display units can be moved in the lateral direction of the drawing and can be fixed to the housing 103b with the projection 205 (e.g., a nail, a hook, a lug, a tab, or a claw) of the support 201 and the projection 207 (e.g., a nail, a hook, a lug, a tab, or a claw) of the housing 103b.

It is possible to bring the two display units of the display device 140 in contact with or close to each other by moving at least one of the two display units.

When a display device that is opened performs display, the two display units are preferably in contact with each other, as shown in FIGS. 5A and 5B. Specifically, the two display units are preferably placed in the housing 103b in an opened state to be in contact with each other such that the second surfaces of the supports 201 face each other. In that case, display is less likely to appear divided when the two display units are used as one screen.

Further, when the display device is folded, the two display units are preferably apart from each other (refer to the perspective view of the display device 120 in FIG. 2D). When the two display units are in contact with each other, as shown in FIG. 5C, the edges of the display units exist on the same plane as the edge of the folded housing 103b at the side surface including the joint portion 106 of the display device; thus, the supports 201 and the display panels 203 are damaged and broken in some cases.

<Materials that can be Used for the Display Device of One Embodiment of the Present Invention>

Next, examples of materials that can be used for the display device of one embodiment of the present invention are described.

[Housing and Support]

The housing and the support can be formed using plastic, a metal, an alloy, rubber, or the like. Plastic, rubber, or the like is preferably used because it can form a housing or a support that is lightweight and less likely to be broken.

When the display unit is bonded to the housing or when the display panel is bonded to the support, any of a variety of adhesives can be used, and for example, a resin that is curable at room temperature (e.g., a two-component-mixture-type resin), a light curable resin, a thermosetting resin, or the like can be used. Alternatively, a sheet-like adhesive may be used.

[Display Panel]

The display panel preferably has flexibility. Note that the display panel does not necessarily have flexibility. For example, a display panel that is shaped in advance to fit the shape of the display device may be used.

There is no particular limitation on the display element included in the display panel, for which a liquid crystal element, a light-emitting element (such as a light-emitting diode, an organic EL element, or an inorganic EL element), a plasma tube, or the like can be used.

For example, it is preferable to use an organic EL element because it makes it easy to provide a lightweight flexible display panel.

The display panel may be an active matrix type or a passive matrix type.

In the case where the display panel is an active matrix type, the structure of a transistor included in the display panel is not limited, and either a top-gate transistor or a bottom-gate transistor may be used. In addition, either an n-channel transistor or a p-channel transistor may be used. Furthermore, there is no particular limitation on a material used for the transistor. For example, a transistor in which silicon or an oxide semiconductor such as an In—Ga—Zn-based metal oxide is used in a channel formation region can be employed.

The display panel may include a sensor such as a touch sensor.

A substrate included in the display panel is preferably formed using a material with high toughness. In that case, a display panel with high impact resistance that is less likely to be broken can be provided. For example, when an organic resin substrate or a substrate formed using a thin metal material or a thin alloy material is used, the display panel can be lightweight and less likely to be broken as compared with the case where a glass substrate is used.

A flexible display panel can be manufactured using a variety of manufacturing methods. It is possible to form elements (e.g., a display element, a transistor, and a color filter) directly over a flexible substrate in the case where the flexible substrate can withstand the temperatures in the manufacturing process.

When a material which is flexible but has high water permeability and low heat resistance (e.g., resin) needs to be used for a substrate, the substrate cannot be exposed to high temperature in the manufacturing process; thus, conditions for forming the elements over the substrate are limited. In such a case, a flexible display panel can be manufactured by a technique in which some components of a display panel are formed over a formation substrate having high heat resistance, and then the components are transferred from the formation substrate to a flexible substrate. Since a transistor and the like can be formed over a formation substrate having high heat resistance, a highly reliable transistor and an insulating layer with sufficiently low water permeability can be formed. Further, these components are transferred to a flexible substrate. In this manner, a flexible display panel with high reliability can be manufactured.

This embodiment can be combined with any other embodiment as appropriate.

Embodiment 2

In this embodiment, a flexible display panel that can be used for the display device of one embodiment of the present invention is described with reference to FIGS. 8A and 8B, FIGS. 9A and 9B, FIGS. 10A and 10B, FIGS. 11A and 11B, FIGS. 12A to 12C, and FIGS. 13A to 13C. When the display panel described in this embodiment is bent, the minimum curvature radius of a bent portion of the display panel can be greater than or equal to 1 mm and less than or equal to 150 mm, greater than or equal to 1 mm and less than or equal to 100 mm, greater than or equal to 1 mm and less than or equal to 50 mm, greater than or equal to 1 mm and less than or equal to 10 mm, or greater than or equal to 2 mm and less than or equal to 5 mm. The display panel in this embodiment is free from breakage of an element even when bent with a small curvature radius (e.g., greater than or equal to 2 mm and less than or equal to 5 mm) and has high reliability. Bending the display panel with a small curvature radius can make the display device of one embodiment of the present invention thin. Bending a light extraction portion 224 with a large curvature radius (e.g., greater than or equal to 5 mm and less than or equal to 100 mm) can provide a large display portion on a side surface of the display device. There is no limitation on the direction in which the display panel in this embodiment is bent. Further, the number of bent portions may be one or more than one.

Specific Example 1

Figure 8A:
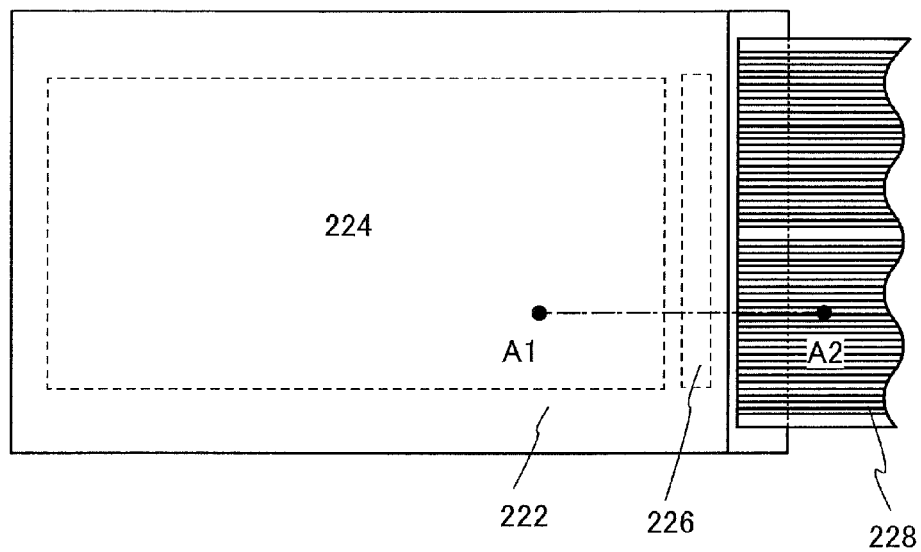
FIGS. 8A and 8B illustrate an example of a display panel of one embodiment of the present invention.
Figure 8B:
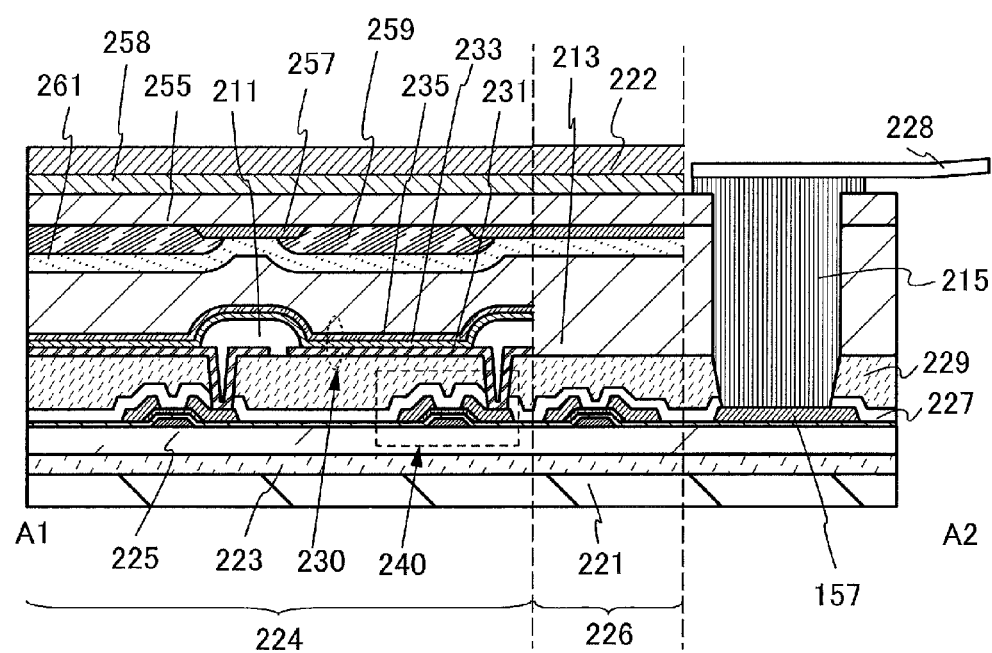

FIG. 8A is a plan view of a display panel, and FIG. 8B is an example of a cross-sectional view taken along dashed-dotted line A1-A2 in FIG. 8A.

The display panel in FIG. 8B includes a substrate 221, a bonding layer 223, an insulating layer 225, a plurality of transistors, a conductive layer 157, an insulating layer 227, an insulating layer 229, a plurality of light-emitting elements, an insulating layer 211, a sealing layer 213, an insulating layer 261, a coloring layer 259, a light-blocking layer 257, an insulating layer 255, a bonding layer 258, and a substrate 222.

The conductive layer 157 is electrically connected to an FPC 228 via a connector 215.

A light-emitting element 230 includes a lower electrode 231, an EL layer 233, and an upper electrode 235. The lower electrode 231 is electrically connected to a source electrode or a drain electrode of a transistor 240. An end portion of the lower electrode 231 is covered with the insulating layer 211. The light-emitting element 230 has a top emission structure. The upper electrode 235 has a light-transmitting property and transmits light emitted from the EL layer 233.

The coloring layer 259 is provided to overlap with the light-emitting element 230, and the light-blocking layer 257 is provided to overlap with the insulating layer 211. The coloring layer 259 and the light-blocking layer 257 are covered with the insulating layer 261. The space between the light-emitting element 230 and the insulating layer 261 is filled with the sealing layer 213.

The display panel includes a plurality of transistors in the light extraction portion 224 and a driver circuit portion 226. The transistor 240 is provided over the insulating layer 225. The insulating layer 225 and the substrate 221 are attached to each other with the bonding layer 223. The insulating layer 255 and the substrate 222 are attached to each other with the bonding layer 258. It is preferable to use films with low water permeability for the insulating layer 225 and the insulating layer 255, in which case an impurity such as water can be prevented from entering the light-emitting element 230 or the transistor 240, leading to improved reliability of the display panel.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

The display panel in Specific Example 1 can be manufactured in the following manner: the insulating layer 225, the transistor 240, and the light-emitting element 230 are formed over a formation substrate with high heat resistance; the formation substrate is separated; and the insulating layer 225, the transistor 240, and the light-emitting element 230 are transferred to the substrate 221 and attached thereto with the bonding layer 223. The display panel in Specific Example 1 can be manufactured in the following manner: the insulating layer 255, the coloring layer 259, and the light-blocking layer 257 are formed over a formation substrate with high heat resistance; the formation substrate is separated; and the insulating layer 255, the coloring layer 259, and the light-blocking layer 257 are transferred to the substrate 222 and attached thereto with the bonding layer 258.

In the case where a material with low heat resistance (e.g., resin) is used for a substrate, it is impossible to expose the substrate to high temperature in the manufacturing process. Thus, there is a limitation on conditions for forming a transistor and an insulating film over the substrate. Further, in the case where a material with high water permeability (e.g., resin) is used for a substrate of a display panel, it is preferable to expose the substrate to high temperature and form a film with low water permeability between the substrate and a light-emitting element. In the manufacturing method of this embodiment, a transistor and the like can be formed over a formation substrate having high heat resistance; thus, the substrate can be exposed to high temperature and a highly reliable transistor and an insulating film with sufficiently low water permeability can be formed. Then, the transistor and the insulating film are transferred to a substrate with low heat resistance, whereby a highly reliable display panel can be manufactured. Thus, with one embodiment of the present invention, a thin or/and lightweight display panel with high reliability can be provided. Details of the manufacturing method will be described later.

The substrate 221 and the substrate 222 are each preferably formed using a material with high toughness. Thus, a display panel with high impact resistance that is less likely to be broken can be provided. For example, when the substrate 222 is an organic resin substrate and the substrate 221 is a substrate formed using a thin metal material or a thin alloy material, the display panel can be lightweight and less likely to be broken as compared with the case where a glass substrate is used.

A metal material and an alloy material, which have high thermal conductivity, are preferred because they can easily conduct heat to the whole substrate and accordingly can prevent a local temperature rise in the display panel. The thickness of a substrate using a metal material or an alloy material is preferably greater than or equal to 10 μm and less than or equal to 200 μm, further preferably greater than or equal to 20 μm and less than or equal to 50 μm.

Further, when a material with high thermal emissivity is used for the substrate 221, the surface temperature of the display panel can be prevented from rising, leading to prevention of breakage or a decrease in reliability of the display panel. For example, the substrate 221 may have a stacked structure of a metal substrate and a layer with high thermal emissivity (the layer can be formed using a metal oxide or a ceramic material, for example).

Specific Example 2

Figure 9A:
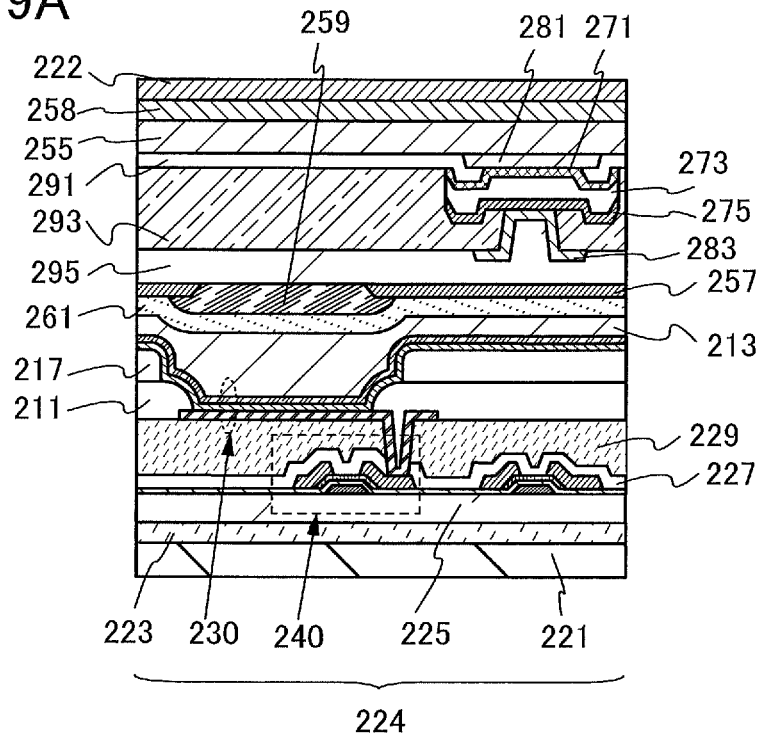
FIGS. 9A and 9B each illustrate an example of a display panel of one embodiment of the present invention.

FIG. 9A shows another example of the light extraction portion 224 in the display panel of one embodiment of the present invention. The display panel shown in FIG. 9A is capable of touch operation. In the following specific examples, description of components similar to those in Specific Example 1 is omitted.

The display panel in FIG. 9A includes the substrate 221, the bonding layer 223, the insulating layer 225, a plurality of transistors, the insulating layer 227, the insulating layer 229, a plurality of light-emitting elements, the insulating layer 211, an insulating layer 217, the sealing layer 213, the insulating layer 261, the coloring layer 259, the light-blocking layer 257, a plurality of light-receiving elements, a conductive layer 281, a conductive layer 283, an insulating layer 291, an insulating layer 293, an insulating layer 295, the insulating layer 255, the bonding layer 258, and the substrate 222.

Specific Example 2 includes the insulating layer 217 over the insulating layer 211. The space between the substrate 222 and the substrate 221 can be adjusted with the insulating layer 217.

FIG. 9A shows an example in which a light-receiving element is provided between the insulating layer 255 and the sealing layer 213. Since the light-receiving element can be placed to overlap with a non-light-emitting region (e.g., a region where the light-emitting element is not provided, such as a region where a transistor or a wiring is provided) of the display panel, the display panel can be provided with a touch sensor without a decrease in the aperture ratio of a pixel (light-emitting element).

As the light-receiving element included in the display panel of one embodiment of the present invention, for example, a PN photodiode or a PIN photodiode can be used. In this embodiment, a PIN photodiode including a p-type semiconductor layer 271, an i-type semiconductor layer 273, and an n-type semiconductor layer 275 is used as the light-receiving element.

Note that the i-type semiconductor layer 273 is a semiconductor in which the concentration of each of an impurity imparting p-type conductivity and an impurity imparting n-type conductivity is $1\times10^{20}$ cm$^{-3}$ or less and which has photoconductivity 100 times or more as high as dark conductivity. The i-type semiconductor layer 273 also includes, in its category, a semiconductor that contains an impurity element belonging to Group 13 or Group 15 of the periodic table. In other words, since an i-type semiconductor has weak n-type electric conductivity when an impurity element for controlling valence electrons is not added intentionally, the i-type semiconductor layer 273 includes, in its category, a semiconductor to which an impurity element imparting p-type conductivity is added intentionally or unintentionally at the time of deposition or after the deposition.

The light-blocking layer 257 is closer to the substrate 221 than is the light-receiving element and overlaps with the light-receiving element. The light-blocking layer 257 between the light-receiving element and the sealing layer 213 can prevent the light-receiving element from being irradiated with light emitted from the light-emitting element 230.

The conductive layer 281 and the conductive layer 283 are electrically connected to the light-receiving element. The conductive layer 281 preferably transmits light incident on the light-receiving element. The conductive layer 283 preferably blocks light incident on the light-receiving element.

It is preferable to provide an optical touch sensor between the substrate 222 and the sealing layer 213 because the optical touch sensor is less likely to be affected by light emitted from the light-emitting element 230 and can have improved S/N ratio.

Specific Example 3

Figure 9B:
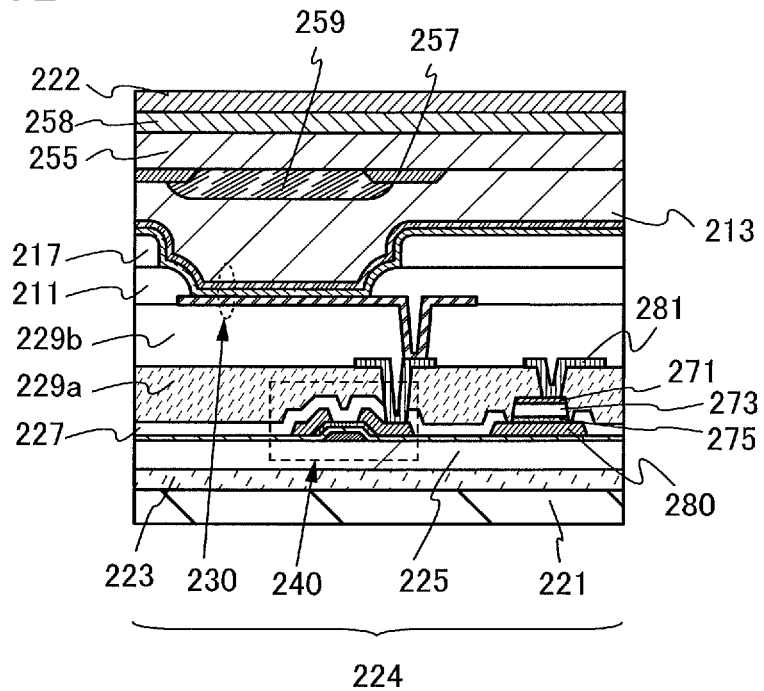

FIG. 9B shows another example of the light extraction portion 224 in the display panel of one embodiment of the present invention. The display panel shown in FIG. 9B is capable of touch operation.

The display panel in FIG. 9B includes the substrate 221, the bonding layer 223, the insulating layer 225, a plurality of transistors, the insulating layer 227, an insulating layer 229a, an insulating layer 229b, a plurality of light-emitting elements, the insulating layer 211, the insulating layer 217, the sealing layer 213, the coloring layer 259, the light-blocking layer 257, a plurality of light-receiving elements, a conductive layer 280, the conductive layer 281, the insulating layer 255, the bonding layer 258, and the substrate 222.

FIG. 9B shows an example in which a light-receiving element is provided between the insulating layer 225 and the sealing layer 213. Since the light-receiving element is provided between the insulating layer 225 and the sealing layer 213, a conductive layer to which the light-receiving element is electrically connected and a photoelectric conversion layer included in the light-receiving element can be formed using the same materials and the same steps as a conductive layer and a semiconductor layer included in the transistor 240. Thus, the display panel capable of touch operation can be manufactured without a significant increase in the number of manufacturing steps.

Specific Example 4

Figure 10A:
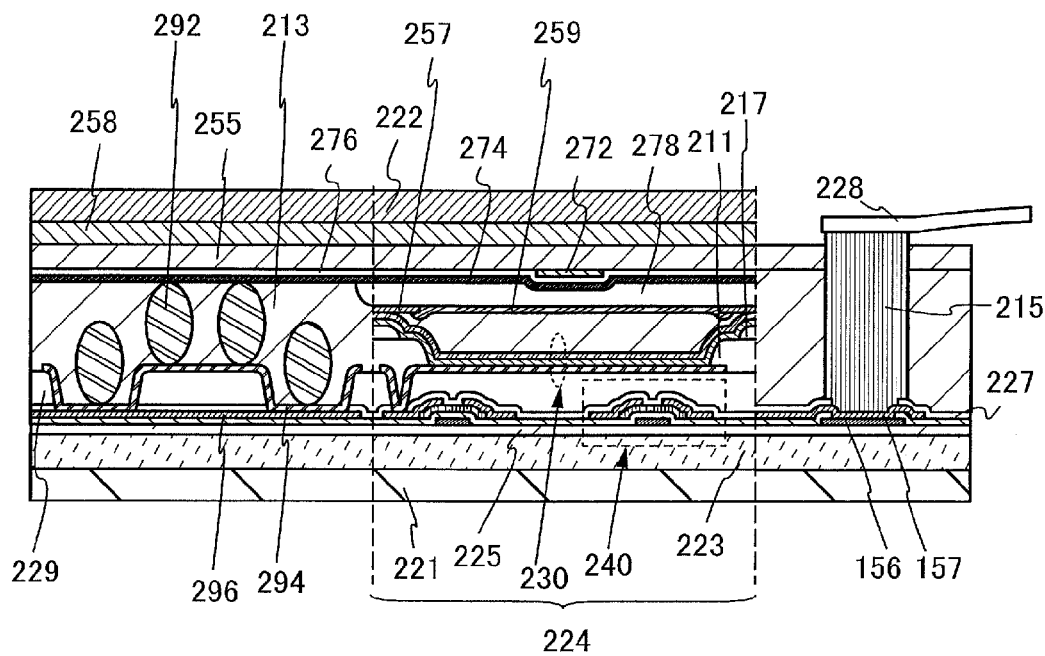
FIGS. 10A and 10B each illustrate an example of a display panel of one embodiment of the present invention.

FIG. 10A shows another example of a display panel of one embodiment of the present invention. The display panel shown in FIG. 10A is capable of touch operation.

The display panel in FIG. 10A includes the substrate 221, the bonding layer 223, the insulating layer 225, a plurality of transistors, a conductive layer 156, the conductive layer 157, the insulating layer 227, the insulating layer 229, a plurality of light-emitting elements, the insulating layer 211, the insulating layer 217, the sealing layer 213, the coloring layer 259, the light-blocking layer 257, the insulating layer 255, a conductive layer 272, a conductive layer 274, an insulating layer 276, an insulating layer 278, a conductive layer 294, a conductive layer 296, the bonding layer 258, and the substrate 222.

FIG. 10A shows an example in which a capacitive touch sensor is provided between the insulating layer 255 and the sealing layer 213. The capacitive touch sensor includes the conductive layer 272 and the conductive layer 274.

The conductive layer 156 and the conductive layer 157 are electrically connected to the FPC 228 via the connector 215. The conductive layer 294 and the conductive layer 296 are electrically connected to the conductive layer 274 via conductive particles 292. Thus, the capacitive touch sensor can be driven via the FPC 228.

Specific Example 5

Figure 10B:
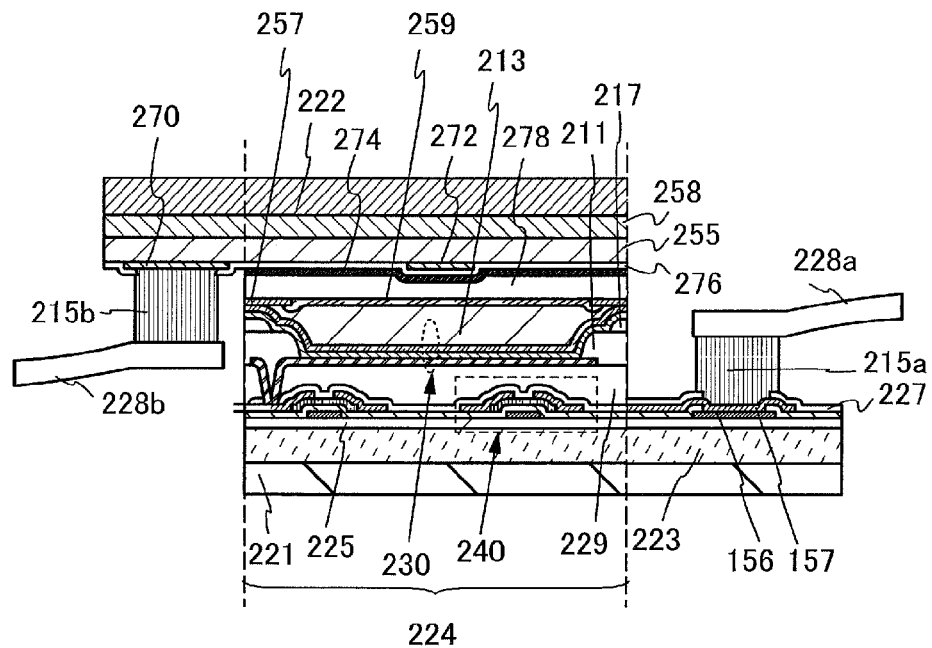

FIG. 10B shows another example of a display panel of one embodiment of the present invention. The display panel shown in FIG. 10B is capable of touch operation.

The display panel in FIG. 10B includes the substrate 221, the bonding layer 223, the insulating layer 225, a plurality of transistors, the conductive layer 156, the conductive layer 157, the insulating layer 227, the insulating layer 229, a plurality of light-emitting elements, the insulating layer 211, the insulating layer 217, the sealing layer 213, the coloring layer 259, the light-blocking layer 257, the insulating layer 255, a conductive layer 270, the conductive layer 272, the conductive layer 274, the insulating layer 276, the insulating layer 278, the bonding layer 258, and the substrate 222.

FIG. 10B shows an example in which a capacitive touch sensor is provided between the insulating layer 255 and the sealing layer 213. The capacitive touch sensor includes the conductive layer 272 and the conductive layer 274.

The conductive layer 156 and the conductive layer 157 are electrically connected to an FPC 228a via a connector 215a. The conductive layer 270 is electrically connected to an FPC 228b via a connector 215b. Thus, the light-emitting element 230 and the transistor 240 can be driven via the FPC 228a, and the capacitive touch sensor can be driven via the FPC 228b.

Specific Example 6

Figure 11A:
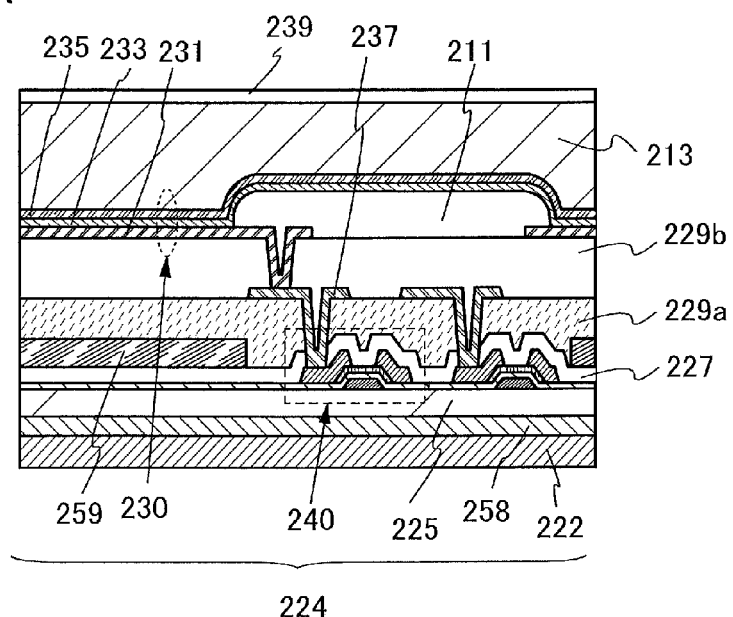
FIGS. 11A and 11B each illustrate an example of a display panel of one embodiment of the present invention.

FIG. 11A shows another example of the light extraction portion 224 in the display panel of one embodiment of the present invention.

The display panel in FIG. 11A includes the substrate 222, the bonding layer 258, the insulating layer 225, a plurality of transistors, the insulating layer 227, a conductive layer 237, the insulating layer 229a, the insulating layer 229b, a plurality of light-emitting elements, the insulating layer 211, the sealing layer 213, the coloring layer 259, and a substrate 239.

The light-emitting element 230 includes the lower electrode 231, the EL layer 233, and the upper electrode 235. The lower electrode 231 is electrically connected to the source electrode or the drain electrode of the transistor 240 via the conductive layer 237. An end portion of the lower electrode 231 is covered with the insulating layer 211. The light-emitting element 230 has a bottom emission structure. The lower electrode 231 has a light-transmitting property and transmits light emitted from the EL layer 233.

The coloring layer 259 is provided to overlap with the light-emitting element 230, and light emitted from the light-emitting element 230 is extracted from the substrate 222 side through the coloring layer 259. The space between the light-emitting element 230 and the substrate 239 is filled with the sealing layer 213. The substrate 239 can be formed using a material similar to that of the substrate 221.

Specific Example 7

Figure 11B:
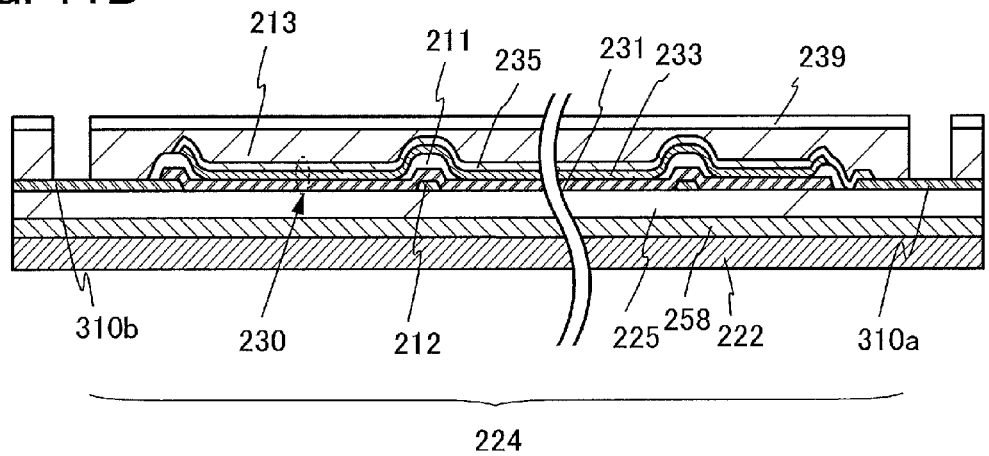

FIG. 11B shows another example of a display panel of one embodiment of the present invention.

The display panel in FIG. 11B includes the substrate 222, the bonding layer 258, the insulating layer 225, a conductive layer 310a, a conductive layer 310b, a plurality of light-emitting elements, the insulating layer 211, a conductive layer 212, the sealing layer 213, and the substrate 239.

The conductive layer 310a and the conductive layer 310b, which are external connection electrodes of the display panel, can each be electrically connected to an FPC or the like.

The light-emitting element 230 includes the lower electrode 231, the EL layer 233, and the upper electrode 235. An end portion of the lower electrode 231 is covered with the insulating layer 211. The light-emitting element 230 has a bottom emission structure. The lower electrode 231 has a light-transmitting property and transmits light emitted from the EL layer 233. The conductive layer 212 is electrically connected to the lower electrode 231.

The substrate 222 may have, as a light extraction structure, a hemispherical lens, a micro lens array, a film provided with an uneven surface structure, a light diffusing film, or the like. For example, the substrate 222 with a light extraction structure can be formed by attaching the above lens or film to a resin substrate with an adhesive or the like having substantially the same refractive index as the substrate or the lens or film.

The conductive layer 212 is preferably, though not necessarily, provided because voltage drop due to the resistance of the lower electrode 231 can be prevented. In addition, for a similar purpose, a conductive layer electrically connected to the upper electrode 235 may be provided over the insulating layer 211, the EL layer 233, the upper electrode 235, or the like.

The conductive layer 212 can be a single layer or a stacked layer formed using a material selected from copper, titanium, tantalum, tungsten, molybdenum, chromium, neodymium, scandium, nickel, or aluminum, an alloy material containing any of these materials as its main component, or the like. The thickness of the conductive layer 212 can be, for example, greater than or equal to 0.1 μm and less than or equal to 3 μm, preferably greater than or equal to 0.1 μm and less than or equal to 0.5 μm.

When a paste (e.g., silver paste) is used as a material for the conductive layer electrically connected to the upper electrode 235, metal particles forming the conductive layer aggregate; therefore, the surface of the conductive layer is rough and has many gaps. Thus, even when the conductive layer is formed over the insulating layer 211, for example, it is difficult for the EL layer 233 to completely cover the conductive layer; accordingly, the upper electrode and the conductive layer are electrically connected to each other easily, which is preferable.

<Examples of Materials>

Next, materials and the like that can be used for a display panel of one embodiment of the present invention are described. Refer also to the above description in this specification.

Examples of materials used for the substrate 221, the substrate 222, and the substrate 239 include glass, a metal, and an organic resin. A material that transmits visible light is used for the substrate on the display surface side of the display panel.

An organic resin, which has a specific gravity smaller than that of glass, is preferably used for the substrate, in which case the display panel can be lightweight as compared with the case where glass is used.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, and a polyvinyl chloride resin. In particular, a material whose thermal expansion coefficient is low is preferred, and for example, a polyamide imide resin, a polyimide resin, or PET can be suitably used. A substrate in which a glass fiber is impregnated with an organic resin or a substrate whose thermal expansion coefficient is reduced by mixing an organic resin with an inorganic filler can also be used.

The substrate may have a stacked structure of a layer of any of the above-mentioned materials and a hard coat layer (e.g., a silicon nitride layer) which protects a surface of the display panel from damage or the like, a layer (e.g., an aramid resin layer) which can disperse pressure, or the like. Furthermore, to suppress a decrease in the lifetime of the light-emitting element due to moisture and the like, an insulating film with low water permeability may be included in the stacked structure.

A material that transmits visible light is used for one of the bonding layer 223 and the bonding layer 258 that is on the display surface side of the display panel.

For the bonding layer, a resin that is curable at room temperature (e.g., a two-component-mixture-type resin), a light curable resin, a thermosetting resin, or the like can be used. Examples of such resins include an epoxy resin, an acrylic resin, a silicone resin, and a phenol resin. In particular, a material with low moisture permeability, such as an epoxy resin, is preferred.

Further, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent an impurity such as moisture from entering the light-emitting element, thereby improving the reliability of the display panel.

In addition, it is preferable to mix a filler with a high refractive index (e.g., titanium oxide) into the resin, in which case the efficiency of light extraction from the light-emitting element can be improved.

The bonding layer may also include a scattering member for scattering light. For example, the bonding layer can be a mixture of the above resin and particles having a refractive index different from that of the resin. The particles function as the scattering member for scattering light.

The difference in refractive index between the resin and the particles with a refractive index different from that of the resin is preferably 0.1 or more, further preferably 0.3 or more. Specifically, an epoxy resin, an acrylic resin, an imide resin, silicone, or the like can be used as the resin, and titanium oxide, barium oxide, zeolite, or the like can be used as the particles.

Particles of titanium oxide or barium oxide are preferable because they scatter light excellently. When zeolite is used, it can adsorb water contained in the resin and the like, thereby improving the reliability of the light-emitting element.

The structure of the transistors in the display panel is not particularly limited. For example, a forward staggered transistor or an inverted staggered transistor may be used. A top-gate transistor or a bottom-gate transistor may be used. A semiconductor material used for the transistors is not particularly limited, and for example, silicon or germanium can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

The light-emitting element included in the display panel includes a pair of electrodes (the lower electrode 231 and the upper electrode 235); and the EL layer 233 between the pair of electrodes. One of the pair of electrodes functions as an anode and the other functions as a cathode.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stack of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Further, lanthanum, neodymium, germanium, or the like may be added to the metal material or the alloy. Furthermore, an alloy containing aluminum (an aluminum alloy) such as an alloy of aluminum and titanium, an alloy of aluminum and nickel, or an alloy of aluminum and neodymium; or an alloy containing silver such as an alloy of silver and copper, an alloy of silver, copper, and palladium, or an alloy of silver and magnesium can be used for the conductive film. An alloy of silver and copper is preferable because of its high heat resistance. Further, when a metal film or a metal oxide film is stacked on and in contact with an aluminum alloy film, oxidation of the aluminum alloy film can be prevented. Examples of a material for the metal film or the metal oxide film are titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

When a voltage higher than the threshold voltage of the light-emitting element is applied between the lower electrode 231 and the upper electrode 235, holes are injected to the EL layer 233 from the anode side and electrons are injected to the EL layer 233 from the cathode side. The injected electrons and holes are recombined in the EL layer 233 and a light-emitting substance contained in the EL layer 233 emits light.

The EL layer 233 includes at least a light-emitting layer. In addition to the light-emitting layer, the EL layer 233 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 233, either a low molecular compound or a high molecular compound can be used, and an inorganic compound may also be used. Each of the layers included in the EL layer 233 can be formed by any of the following methods: an evaporation method (including a vacuum evaporation method), a transfer method, a printing method, an inkjet method, a coating method, and the like.

The insulating layer 225 and the insulating layer 255 can each be formed using an inorganic insulating material. It is particularly preferable to use an insulating film with low water permeability, in which case a highly reliable display panel can be provided.

The insulating layer 227 has an effect of preventing diffusion of impurities into a semiconductor included in the transistor. As the insulating layer 227, an inorganic insulating film such as a silicon oxide film, a silicon oxynitride film, a silicon nitride film, a silicon nitride oxide film, or an aluminum oxide film can be used.

As each of the insulating layers 229, 229a, and 229b, an insulating film with a planarization function is preferably selected in order to reduce surface unevenness due to the transistor or the like. For example, an organic material such as a polyimide resin, an acrylic resin, or a benzocyclobutene-based resin can be used. Other than such organic materials, it is also possible to use a low-dielectric constant material (a low-k material) or the like. Note that the planarization insulating film may have a stacked structure of any of insulating films formed of these materials and inorganic insulating films.

The insulating layer 211 is provided to cover an end portion of the lower electrode 231. In order that the insulating layer 211 be favorably covered with the EL layer 233 and the upper electrode 235 formed thereover, a side wall of the insulating layer 211 preferably has a tilted surface with continuous curvature.

As a material for the insulating layer 211, a resin or an inorganic insulating material can be used. As the resin, for example, a polyimide resin, a polyamide resin, an acrylic resin, a siloxane resin, an epoxy resin, or a phenol resin can be used. In particular, either a negative photosensitive resin or a positive photosensitive resin is preferably used for easy formation of the insulating layer 211.

There is no particular limitation to the method for forming the insulating layer 211; a photolithography method, a sputtering method, an evaporation method, a droplet discharging method (e.g., an inkjet method), a printing method (e.g., a screen printing method or an off-set printing method), or the like may be used.

The insulating layer 217 can be formed using an inorganic insulating material, an organic insulating material, or the like. As the organic insulating material, for example, a negative or positive photosensitive resin, a non-photosensitive resin, or the like can be used. Instead of the insulating layer 217, a conductive layer may be formed. For example, the conductive layer can be formed using a metal material such as titanium or aluminum. When a conductive layer is used instead of the insulating layer 217 and the conductive layer is electrically connected to the upper electrode 235, voltage drop due to the resistance of the upper electrode 235 can be prevented. The insulating layer 217 may have either a tapered shape or an inverse tapered shape.

Each of the insulating layers 276, 278, 291, 293, and 295 can be formed using an inorganic insulating material or an organic insulating material. It is particularly preferable to use an insulating film with a planarization function for each of the insulating layers 278 and 295 in order to reduce surface unevenness due to a sensor element.

For the sealing layer 213, a resin that is curable at room temperature (e.g., a two-component-mixture-type resin), a light curable resin, a thermosetting resin, or the like can be used. For example, a polyvinyl chloride (PVC) resin, an acrylic resin, a polyimide resin, an epoxy resin, a silicone resin, a polyvinyl butyral (PVB) resin, an ethylene vinyl acetate (EVA) resin, or the like can be used. A drying agent may be contained in the sealing layer 213. In the case where light emitted from the light-emitting element 230 is extracted outside through the sealing layer 213, the sealing layer 213 preferably includes a filler with a high refractive index or a scattering member. Materials for the drying agent, the filler with a high refractive index, and the scattering member are similar to those that can be used for the bonding layer 258.

Each of the conductive layers 156, 157, 294, and 296 can be formed using the same material and the same step as a conductive layer included in the transistor or the light-emitting element. The conductive layer 280 can be formed using the same material and the same step as a conductive layer included in the transistor.

For example, each of the conductive layers can be formed to have a single-layer structure or a stacked-layer structure using any of metal materials such as molybdenum, titanium, chromium, tantalum, tungsten, aluminum, copper, neodymium, and scandium, and an alloy material containing any of these elements. Each of the conductive layers may be formed using a conductive metal oxide. As the conductive metal oxide, indium oxide (e.g., $In_2O_3$), tin oxide (e.g., $SnO_2$), zinc oxide (ZnO), ITO, indium zinc oxide (e.g., $In_2O_3$—ZnO), or any of these metal oxide materials in which silicon oxide is contained can be used.

Each of the conductive layers 237, 212, 310a, and 310b can also be formed using any of the above metal materials, alloy materials, and conductive metal oxides.

Each of the conductive layers 272, 274, 281, and 283 is a conductive layer with a light-transmitting property. The conductive layer can be formed using, for example, indium oxide, ITO, indium zinc oxide, zinc oxide, zinc oxide to which gallium is added, or the like. The conductive layer 270 can be formed using the same material and the same step as the conductive layer 272.

As the conductive particles 292, particles of an organic resin, silica, or the like coated with a metal material are used. It is preferable to use nickel or gold as the metal material because contact resistance can be reduced. It is also preferable to use particles each coated with layers of two or more kinds of metal materials, such as particles coated with nickel and further with gold.

For the connector 215, it is possible to use a paste-like or sheet-like material which is obtained by mixture of metal particles and a thermosetting resin and for which anisotropic electric conductivity is provided by thermocompression bonding. As the metal particles, particles in which two or more kinds of metals are layered, for example, nickel particles coated with gold are preferably used.

The coloring layer 259 is a colored layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer 257 is provided between the adjacent coloring layers 259. The light-blocking layer 257 blocks light emitted from the adjacent light-emitting element, thereby preventing color mixture between adjacent pixels. Here, the coloring layer 259 is provided such that its end portion overlaps with the light-blocking layer 257, whereby light leakage can be reduced. The light-blocking layer 257 can be formed using a material that blocks light emitted from the light-emitting element, for example, a metal material, a resin material including a pigment or a dye, or the like. Note that the light-blocking layer 257 is preferably provided in a region other than the light extraction portion 224, such as the driver circuit portion 226, as illustrated in FIG. 8B, in which case undesired leakage of guided light or the like can be prevented.

The insulating layer 261 covering the coloring layer 259 and the light-blocking layer 257 is preferably provided because it can prevent an impurity such as a pigment included in the coloring layer 259 or the light-blocking layer 257 from diffusing into the light-emitting element or the like. For the insulating layer 261, a light-transmitting material is used, and an inorganic insulating material or an organic insulating material can be used. An insulating film with low water permeability may be used for the insulating layer 261. Note that the insulating layer 261 is not necessarily provided.

<Example of Manufacturing Method>

Next, an example of a method for manufacturing a display panel of one embodiment of the present invention will be described with reference to FIGS. 12A to 12C and FIGS. 13A to 13C. Here, the manufacturing method is described using the display panel of Specific Example 1 (FIG. 8B) as an example.

Figure 12A:
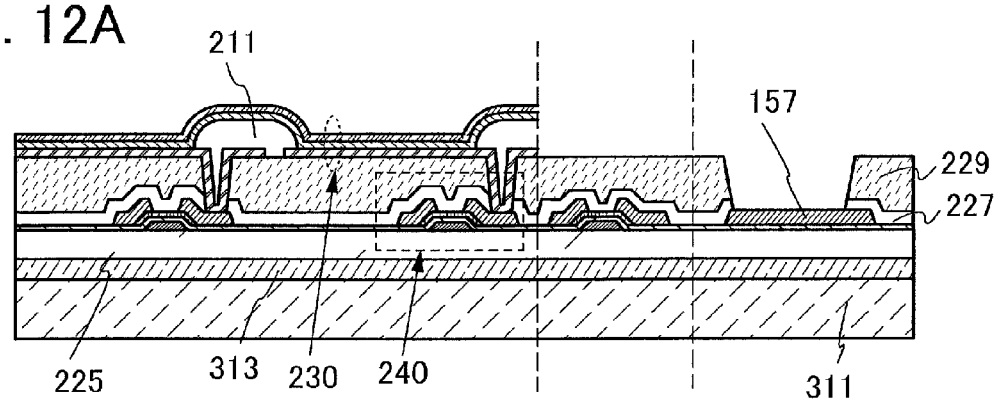
FIGS. 12A to 12C illustrate an example of a method for manufacturing a display panel of one embodiment of the present invention.

First, a separation layer 313 is formed over a formation substrate 311, and the insulating layer 225 is formed over the separation layer 313. Next, the plurality of transistors, the conductive layer 157, the insulating layer 227, the insulating layer 229, the plurality of light-emitting elements, and the insulating layer 211 are formed over the insulating layer 225. An opening is formed in the insulating layers 211, 229, and 227 to expose the conductive layer 157 (FIG. 12A).

Figure 12B:
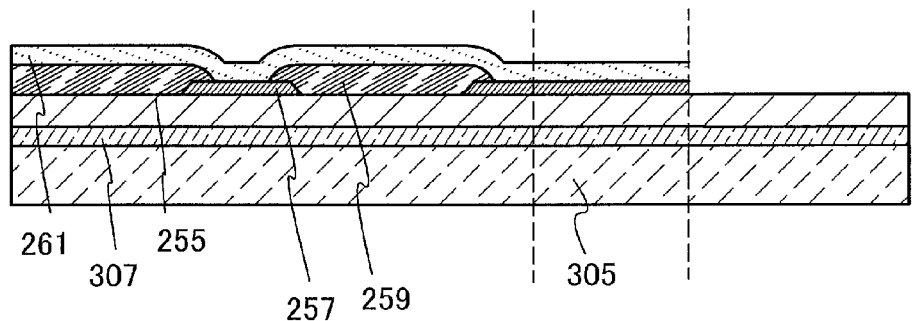

In addition, a separation layer 307 is formed over a formation substrate 305, and the insulating layer 255 is formed over the separation layer 307. Next, the light-blocking layer 257, the coloring layer 259, and the insulating layer 261 are formed over the insulating layer 255 (FIG. 12B).

The formation substrate 311 and the formation substrate 305 can each be a glass substrate, a quartz substrate, a sapphire substrate, a ceramic substrate, a metal substrate, an organic resin substrate, or the like.

For the glass substrate, for example, a glass material such as aluminosilicate glass, aluminoborosilicate glass, or barium borosilicate glass can be used. When the temperature of heat treatment performed later is high, a substrate having a strain point of 730° C. or higher is preferably used. Note that when containing a large amount of barium oxide, the glass substrate can be heat-resistant and more practical. Alternatively, crystallized glass or the like may be used.

In the case where a glass substrate is used as the formation substrate, an insulating film such as a silicon oxide film, a silicon oxynitride film, a silicon nitride film, or a silicon nitride oxide film is preferably formed between the formation substrate and the separation layer, in which case contamination from the glass substrate can be prevented.

The separation layer 313 and the separation layer 307 each have a single-layer structure or a stacked-layer structure containing an element selected from tungsten, molybdenum, titanium, tantalum, niobium, nickel, cobalt, zirconium, zinc, ruthenium, rhodium, palladium, osmium, iridium, and silicon; an alloy material containing any of the elements; or a compound material containing any of the elements. A crystal structure of a layer containing silicon may be amorphous, microcrystal, or polycrystal.

The separation layer can be formed by a sputtering method, a plasma CVD method, a coating method, a printing method, or the like. Note that a coating method includes a spin coating method, a droplet discharge method, and a dispensing method.

In the case where the separation layer has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to an alloy of tungsten and molybdenum, for example.

In the case where the separation layer is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment may be performed in an atmosphere of oxygen, nitrogen, or nitrous oxide alone, or a mixed gas of any of these gasses and another gas. Surface condition of the separation layer is changed by the plasma treatment or heat treatment, whereby adhesion between the separation layer and the insulating layer formed later can be controlled.

Each of the insulating layers can be formed by a sputtering method, a plasma CVD method, a coating method, a printing method, or the like. For example, the insulating layer is formed at a temperature of higher than or equal to 250° C. and lower than or equal to 400° C. by a plasma CVD method, whereby the insulating layer can be a dense film with very low water permeability.

Figure 12C:
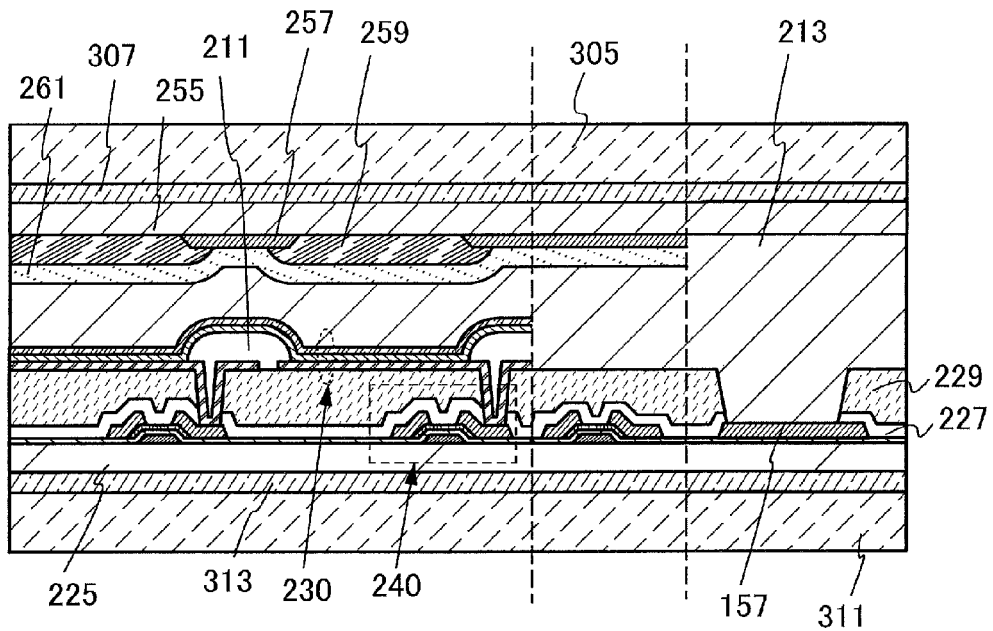

Then, a material for the sealing layer 213 is applied to a surface of the formation substrate 305 over which with the coloring layer 259 and the like are formed or a surface of the formation substrate 311 over which the light-emitting element 230 and the like are formed, and the formation substrate 311 and the formation substrate 305 are attached so that these two surfaces face each other with the sealing layer 213 positioned therebetween (FIG. 12C).

Next, the formation substrate 311 is separated, and the exposed insulating layer 225 and the substrate 221 are attached to each other with the bonding layer 223. Further, the formation substrate 305 is separated, and the exposed insulating layer 255 and the substrate 222 are attached to each other with the bonding layer 258. Although the substrate 222 does not overlap with the conductive layer 157 in FIG. 13A, the substrate 222 may overlap with the conductive layer 157.

Any of a variety of methods can be used as appropriate for the separation process. For example, when a layer including a metal oxide film is formed as the separation layer on the side in contact with the layer to be separated, the metal oxide film is embrittled by crystallization, whereby the layer to be separated can be separated from the formation substrate. Alternatively, when an amorphous silicon film containing hydrogen is formed as the separation layer between the formation substrate having high heat resistance and the layer to be separated, the amorphous silicon film is removed by laser light irradiation or etching, whereby the layer to be separated can be separated from the formation substrate. Alternatively, after a layer including a metal oxide film is formed as the separation layer on the side in contact with the layer to be separated, the metal oxide film is embrittled by crystallization, and part of the separation layer is removed by etching using a solution or a fluoride gas such as $NF_3$, $BrF_3$, or $ClF_3$, whereby the separation can be performed at the embrittled metal oxide film. Furthermore, a method may be used in which a film containing nitrogen, oxygen, hydrogen, or the like (for example, an amorphous silicon film containing hydrogen, an alloy film containing hydrogen, an alloy film containing oxygen, or the like) is used as the separation layer, and the separation layer is irradiated with laser light to release the nitrogen, oxygen, or hydrogen contained in the separation layer as a gas, thereby promoting separation between the layer to be separated and the formation substrate. Alternatively, it is possible to use a method in which the formation substrate provided with the layer to be separated is removed mechanically or by etching using a solution or a fluoride gas such as $NF_3$, $BrF_3$, or $ClF_3$, or the like. In this case, the separation layer is not necessarily provided.

Further, the separation process can be conducted easily by combination of the above-described separation methods. In other words, separation can be performed with physical force (by a machine or the like) after performing laser light irradiation, etching on the separation layer with a gas, a solution, or the like, or mechanical removal with a sharp knife, scalpel or the like so that the separation layer and the layer to be separated can be easily separated from each other.

Separation of the layer to be separated from the formation substrate may be carried out by filling the interface between the separation layer and the layer to be separated with a liquid. Further, the separation may be conducted while pouring a liquid such as water.

As another separation method, in the case where the separation layer is formed using tungsten, it is preferable that the separation be performed while etching the separation layer using a mixed solution of ammonium water and a hydrogen peroxide solution.

Note that the separation layer is not necessary in the case where separation at the interface between the formation substrate and the layer to be separated is possible. For example, glass is used as the formation substrate, an organic resin such as polyimide, polyester, polyolefin, polyamide, polycarbonate, or acrylic is formed in contact with the glass, and an insulating film, a transistor, and the like are formed over the organic resin. In this case, heating the organic resin enables the separation at the interface between the formation substrate and the organic resin. Alternatively, separation at the interface between a metal layer and the organic resin may be performed in the following manner: the metal layer is provided between the formation substrate and the organic resin and current is made to flow in the metal layer so that the metal layer is heated.

Figure 13A:
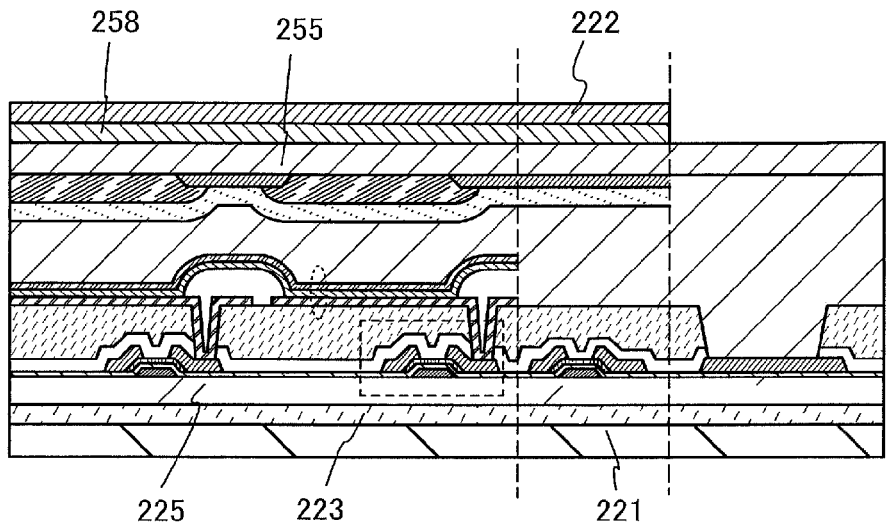
FIGS. 13A to 13C illustrate an example of a method for manufacturing a display panel of one embodiment of the present invention.
Figure 13B:
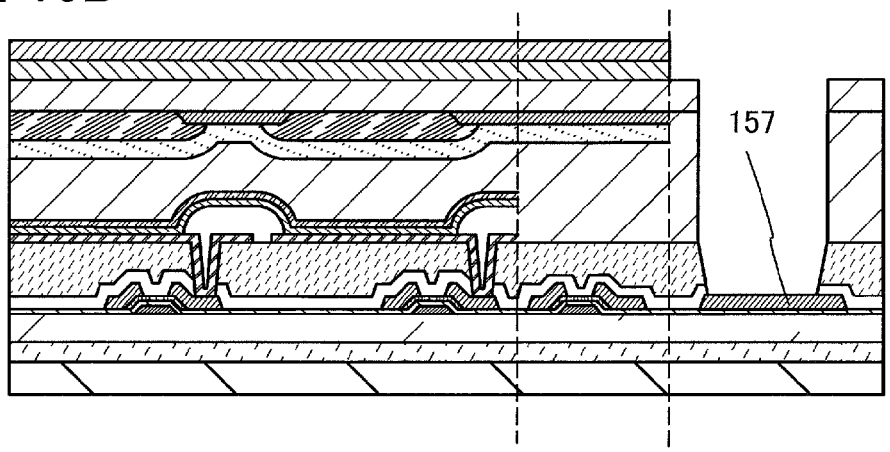
Figure 13C:
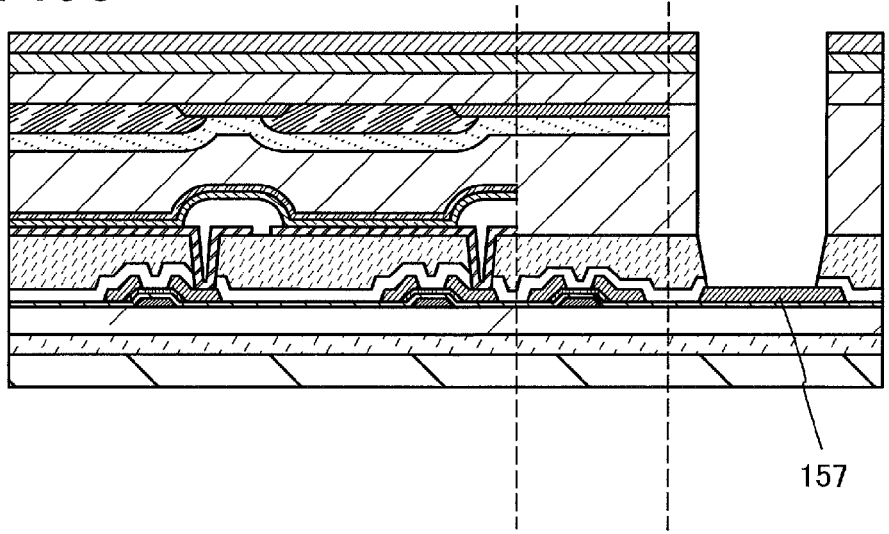

Lastly, an opening is formed in the insulating layer 255 and the sealing layer 213 to expose the conductive layer 157 (FIG. 13B). In the case where the substrate 222 overlaps with the conductive layer 157, the opening is formed also in the substrate 222 and the bonding layer 258 so that the conductive layer 157 is exposed (FIG. 13C). The method for forming the opening is not particularly limited and may be, for example, a laser ablation method, an etching method, an ion beam sputtering method, or the like. As another method, a cut may be made in a film over the conductive layer 157 with a sharp knife or the like and part of the film may be separated by physical force.

In the above-described manner, the display panel of one embodiment of the present invention can be manufactured.

As described above, a display panel of one embodiment of the present invention includes two substrates; one is the substrate 222 and the other is the substrate 221 or the substrate 239. The light-emitting device can be formed with two substrates even when including a touch sensor. Owing to the use of the minimum number of substrates, improvement in light extraction efficiency and improvement in clarity of display can be easily achieved.

This embodiment can be combined with any other embodiment as appropriate.

EXPLANATION OF REFERENCE

101: display unit, 101a: display unit, 101b: display unit, 101c: display unit, 101d: display unit, 103: housing, 103a: housing, 103b: housing, 106: joint portion, 110: display device, 120: display device, 130: display device, 140: display device, 156: conductive layer, 157: conductive layer, 201: support, 203: display panel, 203a: display region, 203b: non-display region, 205: projection, 207: projection, 211: insulating layer, 212: conductive layer, 213: sealing layer, 215: connector, 215a: connector, 215b: connector, 217: insulating layer, 221: substrate, 222: substrate, 223: bonding layer, 224: light extraction portion, 225: insulating layer, 226: driver circuit portion, 227: insulating layer, 228: FPC, 228a: FPC, 228b: FPC, 229: insulating layer, 229a: insulating layer, 229b: insulating layer, 230: light-emitting element, 231: lower electrode, 233: EL layer, 235: upper electrode, 237: conductive layer, 239: substrate, 240: transistor, 255: insulating layer, 257: light-blocking layer, 258: bonding layer, 259: coloring layer, 261: insulating layer, 270: conductive layer, 271: p-type semiconductor layer, 272: conductive layer, 273: i-type semiconductor layer, 274: conductive layer, 275: n-type semiconductor layer, 276: insulating layer, 278: insulating layer, 280: conductive layer, 281: conductive layer, 283: conductive layer, 291: insulating layer, 292: conductive particle, 293: insulating layer, 294: conductive layer, 295: insulating layer, 296: conductive layer, 301: region, 303: region, 305: formation substrate, 307: separation layer, 310a: conductive layer, 310b: conductive layer, 311: formation substrate, 313: separation layer.

This application is based on Japanese Patent Application serial no. 2013-090873 filed with Japan Patent Office on Apr. 24, 2013, the entire contents of which are hereby incorporated by reference.

The invention claimed is:

1. An electronic device comprising:
a support; and
a display panel continuously overlapping a front surface, a first side surface, and a back surface of the support,
wherein the display panel comprises a display region over the front surface and a first part of the first side surface of the support, and
wherein the display panel comprises a non-display region over a second part of the first side surface and the back surface of the support.

2. The electronic device according to claim 1, wherein the display panel further comprises the non-display region surrounding the display region over the front surface and the first part of the first side surface of the support.

3. The electronic device according to claim 1, wherein the display panel further comprises a capacitive touch sensor.

4. The electronic device according to claim 1, wherein the display panel further comprises an optical touch sensor.

5. The electronic device according to claim 1, wherein the display panel comprises a light-emitting element.

6. The electronic device according to claim 1, wherein the display panel is flexible.

7. The electronic device according to claim 1, wherein the display panel does not overlap a second side surface of the support.

8. An electronic device comprising:
a support; and
a display panel continuously overlapping a front surface, a first side surface, a second side surface, and a back surface of the support,
wherein the display panel comprises a display region over the front surface, a first part of the first side surface, and a first part of the second side surface of the support, and
wherein the display panel comprises a non-display region over a second part of the first side surface, a second part of the second side surface, and the back surface of the support.

9. The electronic device according to claim 8, wherein the display panel further comprises the non-display region surrounding the display region over the front surface, the first part of the first side surface, and the first part of the second side surface of the support.

10. The electronic device according to claim 8, wherein the display panel further comprises a capacitive touch sensor.

11. The electronic device according to claim 8, wherein the display panel further comprises an optical touch sensor.

12. The electronic device according to claim 8, wherein the display panel comprises a light-emitting element.

13. The electronic device according to claim 8, wherein the display panel is flexible.

14. An electronic device comprising:
a support;
a display panel continuously overlapping a front surface, a first side surface, and a back surface of the support; and
a housing in which the support and the display panel are incorporated,
wherein the display panel comprises a display region over the front surface and a first part of the first side surface of the support, and
wherein the display panel comprises a non-display region over a second part of the first side surface and the back surface of the support.

15. The electronic device according to claim 14, wherein the display panel further comprises the non-display region surrounding the display region over the front surface and the first part of the first side surface of the support.

16. The electronic device according to claim 14, wherein the display panel further comprises a capacitive touch sensor.

17. The electronic device according to claim 14, wherein the display panel further comprises an optical touch sensor.

18. The electronic device according to claim 14, wherein the display panel comprises a light-emitting element.

19. The electronic device according to claim 14, wherein the display panel is flexible.

20. The electronic device according to claim 14, wherein the display panel does not overlap a second side surface of the support.

* * * * *